United States Patent
Wang et al.

(10) Patent No.: US 11,676,852 B2
(45) Date of Patent: Jun. 13, 2023

(54) PATTERNING METHODS FOR SEMICONDUCTOR DEVICES

(71) Applicant: Taiwan Semiconductor Manufacturing Co., Ltd., Hsinchu (TW)

(72) Inventors: Wei-Ren Wang, New Taipei (TW); Shing-Chyang Pan, Jhudong Township (TW); Ching-Yu Chang, Taipei (TW); Wan-Lin Tsai, Hsinchu (TW); Jung-Hau Shiu, New Taipei (TW); Tze-Liang Lee, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 249 days.

(21) Appl. No.: 17/119,692

(22) Filed: Dec. 11, 2020

(65) Prior Publication Data

US 2021/0134656 A1     May 6, 2021

Related U.S. Application Data

(63) Continuation of application No. 16/010,352, filed on Jun. 15, 2018, now Pat. No. 10,867,839.

(51) Int. Cl.
| | |
|---|---|
| *H01L 21/76* | (2006.01) |
| *H01L 21/768* | (2006.01) |
| *H01L 21/311* | (2006.01) |
| *H01L 21/02* | (2006.01) |
| *H01L 21/033* | (2006.01) |

(52) U.S. Cl.
CPC .... *H01L 21/76802* (2013.01); *H01L 21/0228* (2013.01); *H01L 21/02167* (2013.01); *H01L 21/02211* (2013.01); *H01L 21/02274* (2013.01); *H01L 21/0337* (2013.01); *H01L 21/31144* (2013.01); *H01L 21/76879* (2013.01)

(58) Field of Classification Search
CPC ........ H01L 21/76802; H01L 21/02167; H01L 21/02211; H01L 21/02274; H01L 21/0228; H01L 21/0337; H01L 21/31144; H01L 21/76879; H01L 21/3086; H01L 21/76816; H01L 21/823431; H01L 29/66795; H01L 21/823475; H01L 2221/101
USPC ........................................................ 438/618
See application file for complete search history.

(56) References Cited

U.S. PATENT DOCUMENTS

| | | |
|---|---|---|
| 6,416,933 B1 | 7/2002 | Wexler et al. |
| 8,728,332 B2 | 5/2014 | Lin et al. |
| 8,796,666 B1 | 8/2014 | Huang et al. |

(Continued)

*Primary Examiner* — Mohammad M Hoque
(74) *Attorney, Agent, or Firm* — Slater Matsil, LLP

(57) ABSTRACT

Semiconductor devices and methods of forming semiconductor devices are provided. A method includes forming a first mask layer over an underlying layer, patterning the first mask layer to form a first opening, forming a non-conformal film over the first mask layer, wherein a first thickness of the non-conformal film formed on the top surface of the first mask layer is greater than a second thickness of the non-conformal film formed on a sidewall surface of the first mask layer, performing a descum process, wherein the descum process removes a portion of the non-conformal film within the first opening, and etching the underlying layer using the patterned first mask layer and remaining portions of the non-conformal film as an etching mask.

20 Claims, 17 Drawing Sheets

(56) References Cited

U.S. PATENT DOCUMENTS

| | | |
|---|---|---|
| 8,822,243 B2 | 9/2014 | Yan et al. |
| 8,987,142 B2 | 3/2015 | Lee et al. |
| 9,012,132 B2 | 4/2015 | Chang |
| 9,028,915 B2 | 5/2015 | Chang et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,146,469 B2 | 9/2015 | Liu et al. |
| 9,153,478 B2 | 10/2015 | Liu et al. |
| 9,213,234 B2 | 12/2015 | Chang |
| 9,223,220 B2 | 12/2015 | Chang |
| 9,256,133 B2 | 2/2016 | Chang |
| 9,501,601 B2 | 11/2016 | Chang et al. |
| 9,536,759 B2 | 1/2017 | Yang et al. |
| 9,548,303 B2 | 1/2017 | Lee et al. |
| 2008/0286698 A1 | 11/2008 | Zhuang et al. |
| 2010/0099046 A1 | 4/2010 | Kim et al. |
| 2010/0151685 A1 | 6/2010 | Yasuda |
| 2012/0287507 A1 | 11/2012 | Lee et al. |
| 2013/0034963 A1 | 2/2013 | Chung et al. |
| 2013/0078376 A1 | 3/2013 | Higashino et al. |
| 2014/0038412 A1* | 2/2014 | Hu .................... H01L 21/31144 438/689 |
| 2015/0001687 A1 | 1/2015 | Zhang et al. |
| 2015/0099375 A1 | 4/2015 | Haripin et al. |
| 2015/0140811 A1 | 5/2015 | Huang et al. |

* cited by examiner

PATTERNING METHODS FOR SEMICONDUCTOR DEVICES

CROSS-REFERENCE TO RELATED APPLICATION

This application is a continuation of U.S. patent application Ser. No. 16/010,352, entitled "Patterning Methods for Semiconductor Devices," filed on Jun. 15, 2018, which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
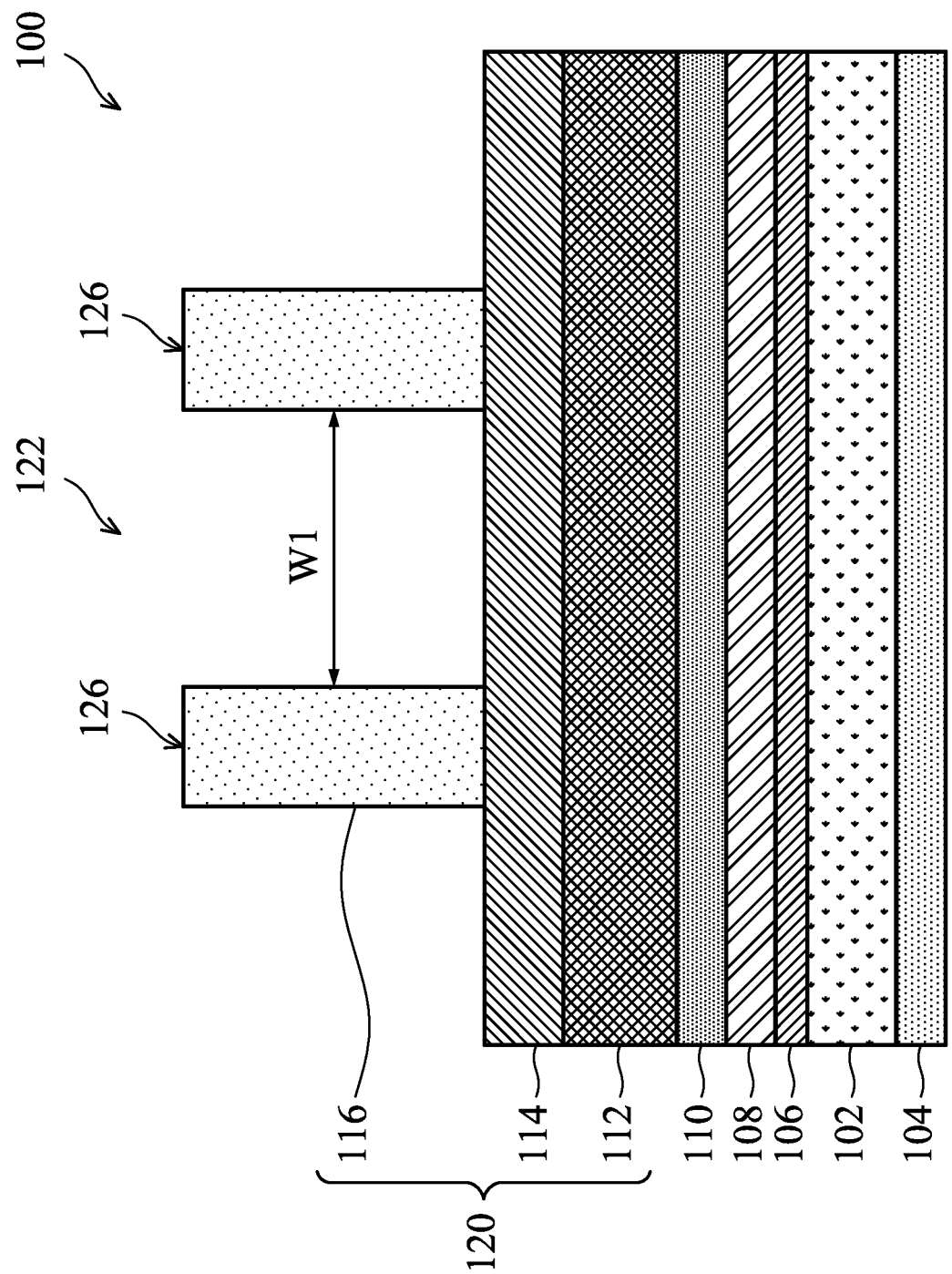
FIGS. 1-2 illustrate cross-sectional views of various intermediary stages of manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1, 2, and 6 through 17 illustrate cross-sectional views of intermediate stages in the formation of features in a target layer 102 on a semiconductor device 100, in accordance with some exemplary embodiments. The target layer 102 is a layer in which a pattern is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (FinFETs).

In FIG. 1, a film stack including the target layer 102 is formed in semiconductor device 100. In some embodiments, the target layer 102 may be formed over a semiconductor substrate 104. The semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AnnAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 104. In other embodiments where the target layer 102 is a semiconductor substrate used to form finFETs, the semiconductor substrate 104 may be omitted.

Although FIG. 1 illustrates target layer 102 being in physical contact with semiconductor substrate 104, any number of intervening layers may be disposed between target layer 102 and semiconductor substrate 104. Such intervening layers may include an inter-layer dielectric (ILD) layer including a low-k dielectric and having contact plugs formed therein, other IMD layers having conductive lines and/or vias formed therein, one or more intermediary layers (e.g., etch stop layers, adhesion layers, etc.), combinations thereof, and the like. For example, an optional etch stop layer (not illustrated) may be disposed directly under the target layer 102. The etch stop layer may act as a stop for an etching process subsequently performed on the target layer 102. The material and process(es) used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), plasma vapor deposition (PVD), or the like. Other materials and processes may be used.

The film stack may further include an anti-reflective coating (ARC) 106 formed over the target layer 102. The ARC 106 aids in the exposure and focus of overlying photoresist layers (discussed below) during patterning of the photoresist layers. In some embodiments, the ARC 106 may be formed from SiON, silicon carbide, materials doped with oxygen (O) and nitrogen (N), or the like. In some embodiments, the ARC 106 is substantially free from nitrogen, and may be formed from an oxide. In such embodiments, the ARC 106 may be also referred to as a nitrogen-free ARC (NFARC). A material composition of ARC 106 may be selected to prevent reflection in some embodiments. The ARC 106 may be formed by Plasma Enhance Chemical Vapor Deposition (PECVD), High-Density Plasma (HDP) deposition, or the like. Other processes and materials may be used.

The film stack further includes a hard mask layer 108 formed over the ARC 106 and the target layer 102. The hard mask layer 108 may be formed of a material that includes a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like). In some embodiments, a material composition of hard mask layer 108 may be determined to provide a high etch selectivity with an underlying layer, for example with respect to ARC 106 and/or target layer 102. Hard mask layer 108 may be formed by PVD, Radio Frequency PVD (RFPVD), Atomic Layer Deposition (ALD), Plasma-Enhanced Atomic Layer Deposition (PEALD), or the like. Other processes and materials may be used. In subsequent processing steps, a mask pattern is formed in the hard mask layer 108 using an embodiment patterning process. The hard mask layer 108 is then used as an etching mask for etching the target layer 102, where the pattern of the hard mask layer 108 is transferred to the target layer 102.

The film stack may further include a dielectric layer 110 formed over the hard mask layer 108. In subsequent processing dielectric layer 110 may be used to form a plurality of spacers that will be used to pattern a target layer. The dielectric layer 110 may be formed from a silicon oxide, such as borophosphosilicate tetraethylorthosilicate (BP-TEOS) or undoped tetraethylorthosilicate (TEOS) oxide, and may be formed by CVD, ALD, PEALD, spin-on coating, or the like. Other processes and materials may be used.

A masking layer may be formed over the dielectric layer 110. In some embodiments, a tri-layer structure such as tri-layer masking layer 120 may be utilized. A tri-layer masking layer 120 is formed on the film stack over the dielectric layer 110. The tri-layer masking layer 120 includes a bottom layer 112, a middle layer 114 over the bottom layer 112, and an upper layer 116 over the middle layer 114. The upper layer 116 may be formed of a photoresist (e.g., a photosensitive material), which includes organic materials, and may be a positive photosensitive material or a negative photosensitive material. The bottom layer 112 may be formed of a polymer in some embodiments. The bottom layer 112 may also be a bottom anti-reflective coating (BARC) layer. The middle layer 114 may include an inorganic material, which may be a nitride (such as silicon nitride), an oxynitride (such as silicon oxynitride), an oxide (such as silicon oxide), or the like. The middle layer 114 may have a high etching selectivity relative to the upper layer 116 and the bottom layer 112. The various layers of the tri-layer masking layer 120 may be blanket deposited sequentially using, for example, spin-on processes. Other processes and materials may be used. Although a tri-layer masking layer 120 is discussed herein, in other embodiments, the tri-layer masking layer 120 may actually be a monolayer masking layer or a bilayer masking layer (e.g., including only the bottom layer 112 and the upper layer 116 without the middle layer 114). The type of masking layer used (e.g., monolayer masking layer, bilayer masking layer, or tri-layer masking layer) may depend on the photolithography process used to pattern the dielectric layer 110. For example, in some extreme ultraviolet (EUV) lithography processes, a monolayer masking layer or bilayer masking layer may be used.

In some embodiments, the upper layer 116 is patterned using a photolithographic process. Subsequently, the upper layer 116 is used as an etching mask for patterning of the middle layer 114 (see FIG. 2). The middle layer 114 is then used as an etching mask for patterning of the bottom layer 112, and the bottom layer 112 is then used to pattern the dielectric layer 110 (see FIG. 3). It has been observed that by using a tri-layer photoresist (e.g., tri-layer photoresist 120) to etch a target layer (e.g., dielectric layer 110), improved definition in fine-pitched patterns can be achieved in the target layer (e.g., dielectric layer 110).

The upper layer 116 is patterned using any suitable photolithography process to form openings 122 therein. Remaining portions of the upper layer 116 are shown as upper masks 126. The openings 122 may define a trench between upper masks 126 having a trench width W 1. As an example of patterning openings 122 in the upper layer 116, a photomask (not shown) may be disposed over the upper layer 116. The upper layer 116 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 116. Exposure of the top photoresist layer may be performed using an immersion lithography system or an extreme ultraviolet lithography system to increase resolution and decrease the minimum achievable pitch. One or multiple exposure steps may be performed. A bake or cure operation may be performed to harden the upper layer 116, and a developer may be used to remove either the exposed or unexposed portions of the upper layer 116 depending on whether a positive or negative resist is used. The openings 122 may have strip shapes in a plan view (not illustrated). In some cases, a minimum trench width W1 of the openings 122 may be about 19 nm. Other widths of the openings 122 are also contemplated.

Figure 2:
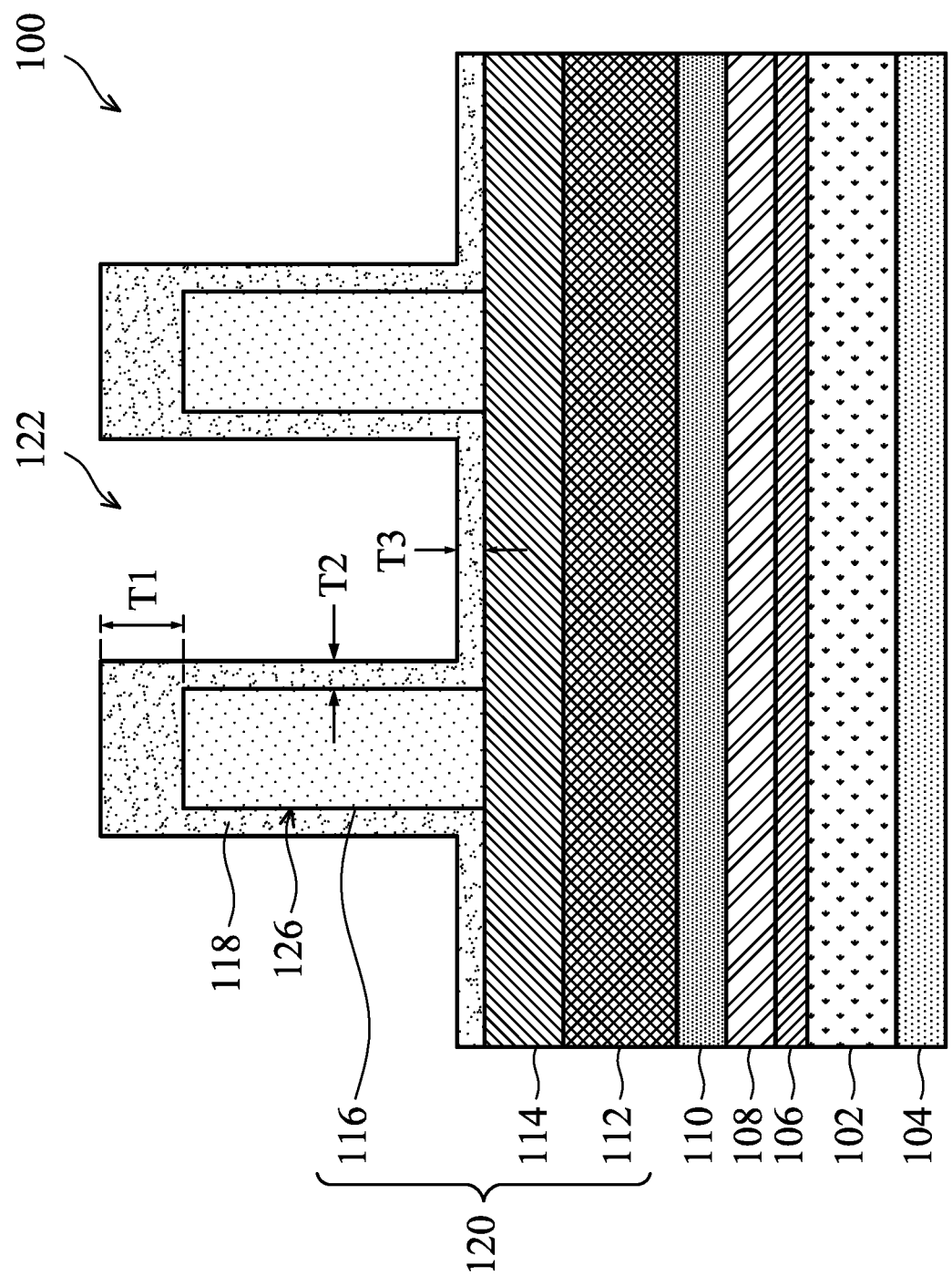

FIG. 2 further illustrates a non-conformal film 118 formed over the upper masks 126 and over the middle layer 114. In some embodiments, the non-conformal film 118 may be formed of SiCN, SiN, SiON, SiCON, SiC, SiOC, $SiC_xN_y$, $SiO_x$, other dielectrics, combinations thereof, or the like, and may be formed by PECVD, LPCVD, PVD, ALD, PEALD, or the like. Other materials and processes may be used. The non-conformal film 118 is formed non-conformally such that different surfaces of the upper masks 126 and the middle layer 114 have different thicknesses of the deposited non-conformal film 118. For example, a thickness of the non-conformal film 118 formed on an upper surface of the upper masks 126 (e.g., top thickness T1) may be greater than a thickness of the non-conformal film 118 formed on a sidewall of the upper masks 126 (e.g., sidewall thickness T2) or a thickness of the non-conformal film 118 formed on the middle layer 114 (e.g., trench thickness T3). For example, in some embodiments a top thickness T1 may be about two times or about three times thicker than a sidewall thickness T2, though the relative thicknesses of top thickness T1 and sidewall thickness T2 may be different than these examples in other embodiments.

Figure 3:
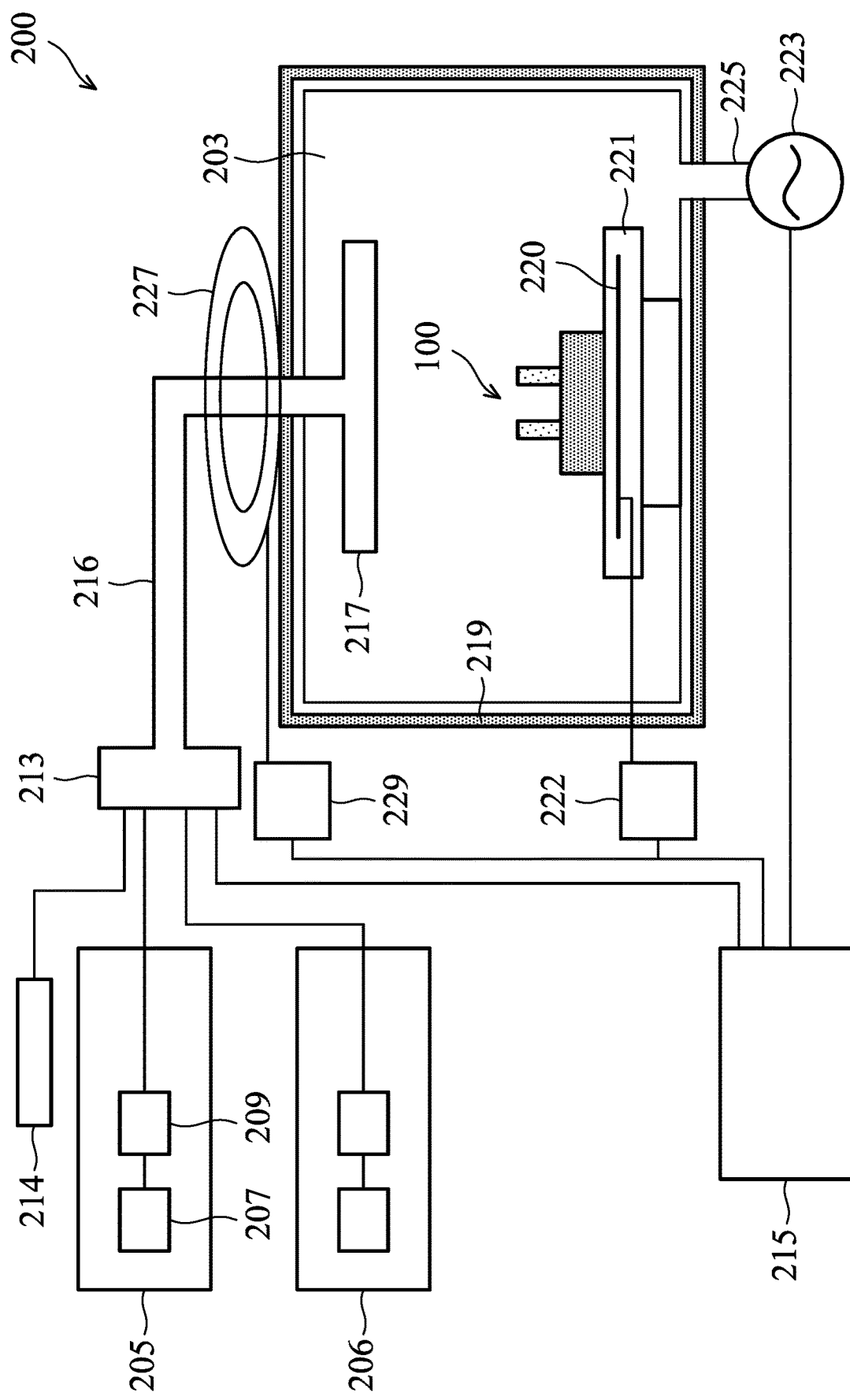
FIG. 3 illustrates a deposition chamber in accordance with some embodiments.
Figure 4:
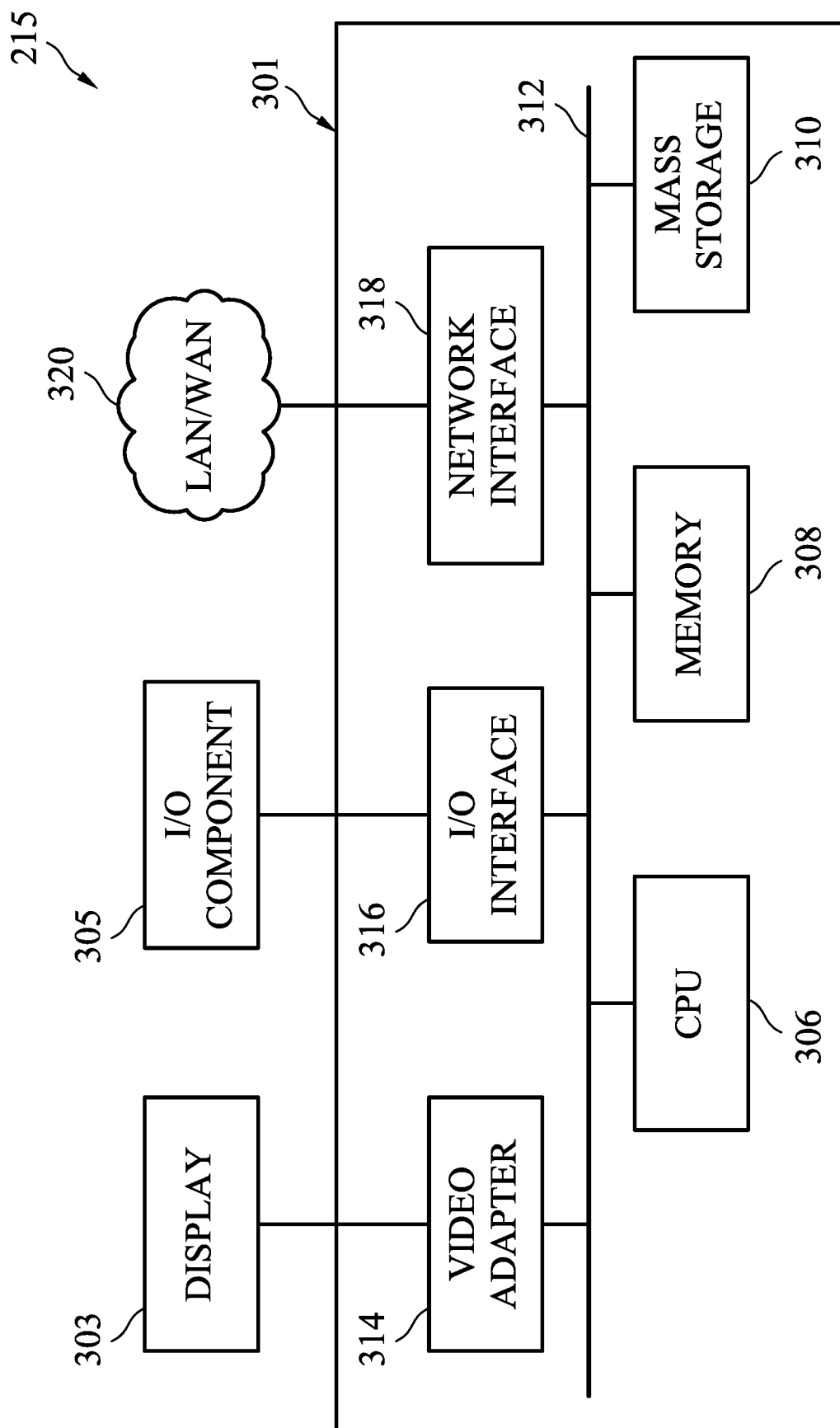
FIG. 4 illustrates a control unit for the deposition chamber in accordance with some embodiments.

FIGS. 3-4 illustrate a deposition system 200 that may be used to form the non-conformal film 118 using an in-situ, conformal deposition process such as Atomic Layer Deposition (ALD) or Plasma-Enhanced Atomic Layer Deposition (PEALD). In an embodiment, the deposition system 200 receives first precursor materials from a first precursor delivery system 205 and/or second precursor materials from a second precursor delivery system 206. In an embodiment, the first precursor delivery system 205 and the second precursor delivery system 206 may work in conjunction with one another to supply the various different precursor materials to a deposition chamber 203 wherein the semiconductor device 100 is placed. The first precursor delivery system 205 and the second precursor delivery system 206 may have physical components that are similar with each other. In other embodiments, fewer or more precursor delivery systems may be used.

For example, the first precursor delivery system 205 and the second precursor delivery system 206 may each include a gas supply 207 and a flow controller 209. In an embodiment in which the first precursor material is stored in a gaseous state, the gas supply 207 may supply the first precursor material to the deposition chamber 203. The gas supply 207 may be a vessel, such as a gas storage tank, that is located either locally to the deposition chamber 203 or else may be located remotely from the deposition chamber 203. Alternatively, the gas supply 207 may be a facility that independently prepares and delivers the first precursor material to the flow controller 209. Any suitable source for the first precursor material may be utilized as the gas supply 207, and all such sources are fully intended to be included within the scope of the embodiments.

The gas supply 207 may supply the desired precursor to the flow controller 209. The flow controller 209 may be used to control the flow of the precursor to the gas controller 213 and, eventually, to the deposition chamber 203, thereby also helping to control the pressure within the deposition chamber 203. The flow controller 209 may be, e.g., a proportional valve, a modulating valve, a needle valve, a pressure regulator, a mass flow controller, combinations of these, or the like. However, any suitable method for controlling and regulating the flow of the precursor materials may be used, and all such components and methods are fully intended to be included within the scope of the embodiments.

However, as one of ordinary skill in the art will recognize, while the first precursor delivery system 205 and the second precursor delivery system 206 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 200, may alternatively be utilized. All such precursor systems are fully intended to be included within the scope of the embodiments.

Additionally, in an embodiment in which the first precursor material is stored in a solid or liquid state, the gas supply 207 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the gas controller 213. Any suitable method and combination of units may be utilized to provide the first precursor, and all such combination of units are fully intended to be included within the scope of the embodiments. In some embodiments, the carrier gas may be nitrogen ($N_2$), helium (He), argon (Ar), combinations of these, or the like, although other suitable carrier gases may alternatively be used.

The first precursor delivery system 205 and the second precursor delivery system 206 may supply their individual precursor materials into a gas controller 213. The gas controller 213 connects and isolates the first precursor delivery system 205 and the second precursor delivery system 206, and the reactant delivery system 208 from the deposition chamber 203 in order to deliver the desired precursor materials to the deposition chamber 203. The gas controller 213 may include such devices as valves, flow meters, sensors, and the like to control the delivery rates of each of the precursors, and may be controlled by instructions received from the control unit 215 (described further below with respect to FIG. 3). In some embodiments a purge gas delivery system 214 may be connected to the gas controller 213 and provide a purge gas to the deposition chamber 203. The purge gas delivery system 214 may include a gaseous tank or other facility that provides a purge gas such as nitrogen ($N_2$), helium (He), argon (Ar), xenon (Xe), or combinations of these, or the like, although other suitable purge gases may alternatively be used.

The gas controller 213, upon receiving instructions from the control unit 215, may open and close valves so as to connect one or more of the first precursor delivery system 205 or the second precursor delivery system 206 to the deposition chamber 203 and direct a desired precursor material through a manifold 216, used the deposition chamber 203, and to a showerhead 217. The showerhead 217 may be used to disperse the chosen precursor materials into the deposition chamber 203 and may be designed to evenly disperse the precursor materials in order to minimize undesired process conditions that may arise from uneven dispersal. In an embodiment the showerhead 217 may have a circular design with openings dispersed evenly around the showerhead 217 to allow for the dispersal of the desired precursor materials into the deposition chamber 203.

However, as one of ordinary skill in the art will recognize, the introduction of precursor materials to the deposition chamber 203 through a single showerhead 217 or through a single point of introduction as described above is intended to be illustrative only and is not intended to be limiting to the embodiments. Any number of separate and independent showerheads 217 or other openings to introduce precursor materials into the deposition chamber 203 may alternatively be used. All such combinations of showerheads and other points of introduction are fully intended to be included within the scope of the embodiments.

The deposition chamber 203 may receive the desired precursor materials and expose the precursor materials to the semiconductor device 100. The deposition chamber 203 may be any desired shape that may be suitable for dispersing the precursor materials and contacting the precursor materials with the semiconductor device 109. In the embodiment illustrated in FIG. 3, the deposition chamber 203 has a cylindrical sidewall and a bottom. However, the deposition chamber 203 is not limited to a cylindrical shape, and any other suitable shape, such as a hollow square tube, an octagonal shape, or the like, may be used. Furthermore, the deposition chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, combinations of these, and like.

Within the deposition chamber 203 the semiconductor device 100 may be placed on a mounting platform 221 in order to position and control the semiconductor device 100 during the deposition processes. The mounting platform 221 may include heating mechanisms in order to heat the semiconductor device 100 during the deposition processes. Furthermore, while a single mounting platform 221 is illustrated in FIG. 3, any number of mounting platforms 221 may additionally be included within the deposition chamber 203.

Additionally, the deposition chamber 203 and the mounting platform 221 may be part of a cluster tool system (not shown). The cluster tool system may be used in conjunction with an automated handling system in order to position and place the semiconductor device 100 into the deposition chamber 203 prior to the deposition processes, position, hold the semiconductor device 100 during the deposition process, and remove the semiconductor device 100 from the deposition chamber 203 after the deposition process.

The mounting platform 221 may additionally include a first electrode 220 coupled to a first RF generator 222. The first electrode 220 may be electrically biased by the first RF generator 222 (under control of the control unit 215) at a RF voltage during the deposition process. By being electrically biased, the first electrode 220 is used to provide a bias to the incoming gaseous material (e.g., precursors, carrier gases, purge gases, etc.) and assist to ignite them into a plasma during a step of the deposition process. Additionally, the first electrode 220 is also used to maintain the plasma during the deposition process by maintaining the bias.

The deposition chamber 203 also includes an upper electrode 227, for use as a plasma generator. In some embodiments, the plasma generator may be a transformer coupled plasma generator and may be, e.g., a coil. The coil may be attached to a second RF generator 229 that is used to provide power to the upper electrode 227 (under control of the control unit 215) in order to ignite the plasma during introduction of the gaseous material. However, while the upper electrode 227 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may alternatively be used. All such methods are fully intended to be included within the scope of the embodiments.

The deposition chamber 203 may also have an exhaust outlet 225 for exhaust gases to exit the deposition chamber 203. A vacuum pump 223 may be connected to the exhaust outlet 225 of the deposition chamber 203 in order to help evacuate the exhaust gases. The vacuum pump 223, under control of the control unit 215, may also be utilized to reduce and control the pressure within the deposition chamber 203 to a desired pressure and may also be used to evacuate precursor materials or reaction byproducts from the deposition chamber 203 in preparation for another step of the deposition process.

FIG. 4 illustrates an embodiment of the control unit 215 that may be utilized to control the gas controller 213 and the vacuum pump 223 (as illustrated in FIG. 3). The control unit 215 may be any form of computer processor that can be used in an industrial setting for controlling process machines. In an embodiment the control unit 215 may include a processing unit 201, such as a desktop computer, a workstation, a laptop computer, or a dedicated unit customized for a particular application. The control unit 215 may be equipped with a display 303 and one or more input/output components 305, such as instruction outputs, sensor inputs, a mouse, a keyboard, printer, combinations of these, or the like. The processing unit 301 may include a central processing unit (CPU) 306, memory 308, a mass storage device 310, a video adapter 314, and an I/O interface 316 connected to a bus 312.

The bus 312 may be one or more of any type of several bus architectures including a memory bus or memory controller, a peripheral bus, or video bus. The CPU 306 may include any type of electronic data processor, and the memory 308 may include any type of system memory, such as static random access memory (SRAM), dynamic random access memory (DRAM), or read-only memory (ROM). The mass storage device 310 may include any type of storage device configured to store data, programs, and other information and to make the data, programs, and other information accessible via the bus 312. The mass storage device 310 may include, for example, one or more of a hard disk drive, a magnetic disk drive, or an optical disk drive.

The video adapter 314 and the I/O interface 316 provide interfaces to couple external input and output devices to the processing unit 301. As illustrated in FIG. 3, examples of input and output devices include the display 303 coupled to the video adapter 314 and the I/O component 305, such as a mouse, keyboard, printer, and the like, coupled to the I/O interface 316. Other devices may be coupled to the processing unit 301, and additional or fewer interface cards may be utilized. For example, a serial interface card (not shown) may be used to provide a serial interface for a printer. The processing unit 301 also may include a network interface 318 that may be a wired link to a local area network (LAN) or a wide area network (WAN) 320 and/or a wireless link.

It should be noted that the control unit 215 may include other components. For example, the control unit 215 may include power supplies, cables, a motherboard, removable storage media, cases, and the like. These other components, although not shown in FIG. 4, are considered part of the control unit 215.

Once the first precursor material and the second precursor material have been placed into the first precursor delivery system 205 and the second precursor delivery system 206, respectively, the formation of the non-conformal film 118 may be initiated by the control unit 215 sending an instruction to the gas controller 213 to connect the first precursor delivery system 205 and the second precursor delivery system 206 to the deposition chamber 203. Once connected, the first precursor delivery system 205 and the second precursor delivery system 206 can deliver the first precursor material and the second precursor material to the showerhead 217 through the gas controller 213 and the manifold 216. The showerhead 217 can then disperse the first precursor material and the second precursor material into the deposition chamber 203, wherein the first precursor material and the second precursor material can be adsorbed and react with each other to form the non-conformal film 118 on the semiconductor device 100. In some embodiments only a first precursor material is used to form the non-conformal film 118.

In a particular embodiment, the deposition process for forming the non-conformal film 118 may be a plasma-enhanced atomic layer deposition (PEALD) process including a number of repeated deposition cycles, in which each cycle includes a number of steps. For example, a deposition cycle may include a precursor dosing step, a precursor purge step, a plasma exposure step, and a plasma purge step. In a precursor dosing step, one or more precursor materials are flowed into the deposition chamber 203. During the precursor dosing step, the precursor materials are able to adsorb onto some exposed surfaces of the semiconductor device 100. For example, first precursor material may be introduced into the deposition chamber 203 and may adsorb onto surfaces of the upper masks 126, surfaces of the middle layer 114, material formed from previous deposition cycles, or other surfaces. In some cases, more than one precursor material may be introduced into the deposition chamber 203 at the same time. The first precursor material may react with open active sites located on the exposed surfaces. However, once all of the open active sites on the exposed surfaces have reacted with the first precursor material, the reaction stops, as there are no more open active sites to which the first precursor materials may bond. In some cases, this may allow the reaction of the first precursor material to be self-limiting and to form a monolayer of the reacted precursor materials on the exposed surfaces, thereby allowing for a more precise control of the thickness of the non-conformal film 118 on different surfaces. In some embodiments, a precursor material may be flowed into the deposition chamber 203 at a rate of between about 200 sccm and about 20,000 sccm, such as about 4,000 sccm. Additionally, a purge gas may be set to a flow rate of between about 200 sccm and about 20,000 sccm, such as about 4,000 sccm. In some embodiments, the pressure within the deposition chamber 203 may be between about 2 mTorr and about 10 mTorr, such as about 4 mTorr. In some embodiments, the temperature of the deposition chamber 203 may be between about 50° C. and about 150° C., such as about 75° C.

In a precursor purge step, the deposition chamber 203 may be purged of some amount of the precursor materials introduced in the precursor dosing step. For example, the control unit 215 may instruct the gas controller 213 to disconnect the first precursor delivery system 205 and/or the second precursor delivery system 206. The gas controller 213 may connect a purge gas delivery system 214 to deliver a purge gas to the deposition chamber 203. Additionally, the control unit 215 may also initiate the vacuum pump 223 in order to apply a pressure differential to the deposition chamber 203 to aid in the removal of the precursor materials. In some embodiments, the purge gas may purge the first precursor material from the deposition chamber 203 for about 0.1 seconds or more. In some embodiments, a purge gas may be set to a flow rate of between about 200 sccm and about 20,000 sccm, such as about 4,000 sccm. In some embodiments, the pressure within the deposition chamber 203 may be between about 2 mTorr and about 10 mTorr, such as about 4 mTorr. In some embodiments, the temperature of the deposition chamber 203 may be between about 50° C. and about 150° C., such as about 75° C.

In a plasma exposure step, the control unit 215 performs an ignition step and ignites material within the deposition chamber 203 into a plasma. The plasma may be ignited from a purge gas, precursor materials, or another material introduced into the deposition chamber 203. The radicals formed by igniting the by plasma may react with the previously adsorbed precursor material, preparing surfaces of the adsorbed precursor material for adsorption of materials during a subsequent cycle. Preparing the surfaces may allow the same type of precursor material or another type of precursor material to adsorb onto the prepared surfaces during a subsequent cycle. In some embodiments, the plasma is ignited at an RF power of between about 2 MHz to about 20 MHz, such as about 13.56 MHz. The plasma may be maintained for a time of between about 0.1 seconds and about 2 seconds, such as about 1 second. In some embodiments, the pressure within the deposition chamber 203 may be between about 2 mTorr and about 10 mTorr, such as about 4 mTorr. In some embodiments, during the plasma exposure step, purge gas may be flowed at a rate of between about 200 sccm and about 20,000 sccm, such as about 4,000 sccm. In some embodiments, the temperature of the deposition chamber 203 may be between about 50° C. and about 150° C., such as about 75° C.

In a plasma purge step, the deposition chamber 203 may be purged of some amount of excess precursor materials, plasma reaction byproducts, or other materials present after the plasma exposure step. For example, the gas controller 213 may connect a purge gas delivery system 214 to deliver a purge gas to the deposition chamber 203. Additionally, the control unit 215 may also initiate the vacuum pump 223 in order to apply a pressure differential to the deposition chamber 203 to aid in the removal of materials within the deposition chamber 203. In some embodiments, the purge gas may purge the first precursor material from the deposition chamber 203 for about 0.1 seconds or more. In some embodiments, a purge gas may be set to a flow rate of between about 200 sccm and about 20,000 sccm, such as about 4,000 sccm. In some embodiments, the pressure within the deposition chamber 203 may be between about 2 mTorr and about 10 mTorr, such as about 4 mTorr. In some embodiments, the temperature of the deposition chamber 203 may be between about 50° C. and about 150° C., such as about 75° C.

After a deposition cycle is completed, another deposition cycle may be repeated. In this manner, a material such as non-conformal film 118 may be deposited over a sequence of deposition cycles. In some cases, a first deposition cycle using a first precursor material may be alternated with a second deposition cycle using a second precursor material. In other cases, additional precursors and associated deposition cycles may be used. In other cases, a deposition cycle may be used with a treatment gas to prepare exposed surfaces for a subsequent deposition cycle.

In some embodiments, the deposition system 200 described in FIGS. 3-4 may be used to deposit a non-conformal film such as non-conformal film 118 shown in FIG. 2 and FIG. 5A-6. In some embodiments, the non-conformal film 118 may include silicon carbonitride (SiCN), though the non-conformal film 118 may include other materials such as polysilicon, SiO2, TiO2, amorphous carbon, or others. In some cases, an SiCN film may also have some oxygen (O) or hydrogen (H) present. For example, a SiCN non-conformal film 118 may react with O upon exposure to the atmosphere. In some embodiments, a SiCN non-conformal film 118 may be formed using one or more precursor materials, including SAM-24 (Bis(DiEthylAmino)Silane), Tris(DiMethylAmino)Silane, Bis(Tert-ButylAmino)Silane, Di(isopropylamino)Silane, (i-PrHN)$_2$SiH$_2$, DIPAS, or another type of precursor material. In an embodiment to form a SiCN non-conformal film 118, the first precursor material may be flowed into the deposition chamber 203 at a flow rate of about 4,000 sccm for about 0.2 seconds during a precursor doping step. Additionally, the deposition chamber 203 may be held at a pressure of about 4 mTorr and a temperature of about 75° C. A precursor purge step may include flowing a purge gas at a flow rate of about 4,000 sccm for about 0.1 seconds. Additionally, the deposition chamber 203 may be held at a pressure of about 4 mTorr and a temperature of about 75° C. A plasma exposure step may have a plasma generator power of about 13.56 MHz, and may maintain the plasma for about 1 second. In some embodiments, a purge gas of N$_2$ is flowed during the plasma exposure step and a nitrogen plasma is created, though other types of plasma may be used. Additionally, the deposition chamber 203 may be held at a pressure of about 4 mTorr and a temperature of between about 75° C. A plasma purge step may include flowing a purge gas at a flow rate of about 4,000 sccm for about 0.8 seconds. Additionally, the deposition chamber 203 may be held at a temperature of about 75° C. However, as one of ordinary skill in the art will recognize, these process conditions are only intended to be illustrative, as any suitable process conditions may be utilized while remaining within the scope of the embodiments.

In some embodiments, the non-conformal film 118 may be formed such that different portions of the non-conformal film 118 formed on different surfaces have different thicknesses. Turning to the examples shown in FIGS. 5A-5C, a non-conformal film 518 is formed over a feature 516 which has been formed on a layer 514. The non-conformal film 518 may be similar to the non-conformal film 118, the feature 516 may be similar to upper masks 126, and the layer 514 may be similar to middle layer 114, described herein. For example, feature 516 may be a patterned photoresist or another type of feature, and may be formed having a height H2 and a width W2. The non-conformal film 518 may be deposited using techniques described herein, though other types of film or other techniques may also be used. As shown in the example of FIG. 5A, a top thickness T1 of the non-conformal film 518 on the top surface of the feature 516 may be greater than a sidewall thickness T2 of the non-conformal film 518 on a sidewall of the feature 516. A top thickness T1 of the non-conformal film 518 may also be greater than a trench thickness T3 of the non-conformal film 518 on the surface of layer 514. In some cases, a sidewall thickness T2 may be about the same or greater than a trench thickness T3. For example, the non-conformal film 518 may have a top thickness T1 of between about 5 nm and about 10 nm, a sidewall thickness T2 of between about 1 nm and about 3 nm, and a trench thickness T3 of between about 1 nm and about 3 nm. These are examples, a non-conformal film such as described herein may have other thicknesses than these, and may be thinner or thicker in other cases. In some cases, a top thickness T1 may be about three times larger than a sidewall thickness T2, though in other cases a top thickness T1 may be less than or greater than three times larger than a sidewall thickness T2. For example, the ratio of T1:T2 may be between about 3:1 and about 5:1, or the ratio of T1:T3 may be between about 3:1 and about 5:1. In some cases, a larger T1:T2 ratio or T1:T3 ratio may allow for a more thorough descum process with reduced chance of damage to patterned features, described in greater detail below.

Figure 5B:
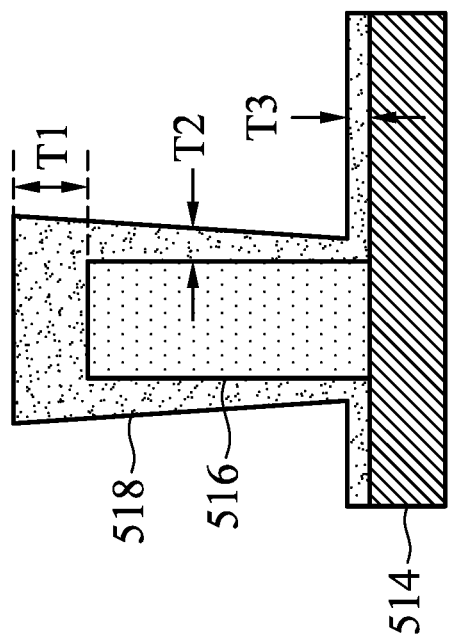
FIGS. 5A-5C illustrate cross-sectional views of various intermediary stages of manufacturing a semiconductor device in accordance with some embodiments.

FIG. 5B shows an example in which the thickness of the non-conformal film 518 over the sidewalls of the feature 516 is thicker near the top of the feature 516 than near the bottom of the feature 516.

Figure 5C:
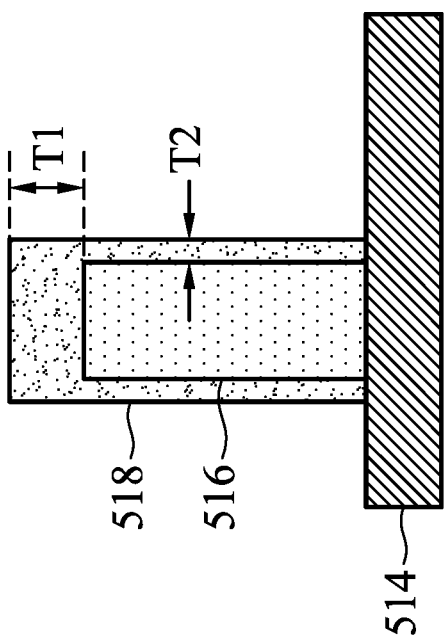
Figure 5A:
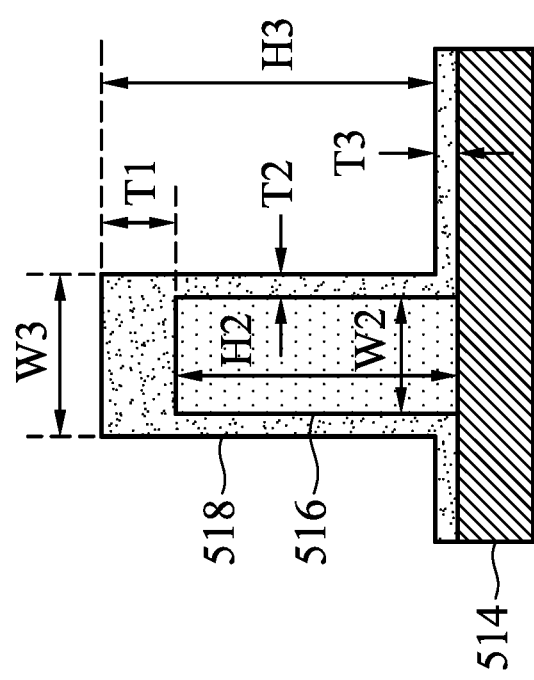

FIG. 5C shows another example in which a top thickness T1 is greater than a sidewall thickness T2, but very little or none of non-conformal film 518 is formed on the layer 514. In some embodiments, an inhibitor material may be deposited on the layer 514 that inhibits formation of a non-conformal film on the layer 514. As shown in FIGS. 5A-5C, depositing a non-conformal film as described herein over a feature can increase the overall height of the feature (e.g., from H2 to H3) more than the non-conformal film increases the overall width of the feature (e.g., from W2 to W3).

In some embodiments, the different thicknesses of portions of a deposited non-conformal film may be controlled by controlling characteristics of the deposition cycles or by controlling the topography of the features over which the non-conformal film is formed. In some embodiments, a top thickness T1 of the non-conformal film can be growth thicker relative to a sidewall thickness T2 by controlling the duration in time of each deposition cycle step. For example, the top thickness T1 may be grown relatively thicker by increasing the duration of precursor dosing time of the precursor dosing step, reducing the duration of purge time in the precursor purge step, or increasing the duration of time the plasma is maintained in the plasma exposure step.

In some embodiments, the topography of the features can also be controlled to affect the non-conformal film thicknesses. For example, a narrowing the trench width W1 between two features (e.g., a narrower trench width W1 as shown in FIG. 1) may cause a top thickness T1 to be greater relative to a sidewall thickness T2 or a trench thickness T3. For example, in some cases a trench width W1 of about 20 nm or less may cause a top thickness T1 of the non-conformal film to be about three times greater than a sidewall thickness T2 of the non-conformal film. In some cases, narrowing the trench width W1 may cause little or no non-conformal film to be formed on the bottom surface of the trench. In some cases, increasing the trench width W1 between two features may cause a top thickness T1, a sidewall thickness T2, and a trench thickness T3 to be more similar. In some embodiments, a dummy feature may be utilized to control the spacing and thicknesses. For example, in some cases, a trench width W1 of about 100 nm or greater may cause a top thickness T1, a sidewall thickness T2, and a trench thickness T3 to be about the same thickness. In some cases, a feature having a greater height-to-width ratio (e.g., H2/W2) may cause a top thickness T1 of the non-conformal film deposited on that feature to be greater relative to a sidewall thickness T2 of the non-conformal film or relative to a trench thickness T3 of the non-conformal film. In this manner, the non-conformal characteristics of the non-conformal film may be controlled through deposition process parameters and characteristics of the features over which the non-conformal film is formed.

After the non-conformal film 118 has been formed over the upper masks 126 and the middle layer 114, a descum process may be performed. The descum process may be used to remove unwanted residue ("scum") from surfaces of the middle layer 114. For example, after patterning of the upper layer 116, some phororesist residue may remain on portions of the middle layer 114. The presence of a residue may interfere with subsequent processing steps. For example, regions of the middle layer 114 covered in a residue may not be completely etched during patterning of the middle layer 114, which may result in defects in the semiconductor device 100. A descum process may thus be used to remove any residue present on the middle layer 114. In some cases, the descum process may include a plasma process, such as an oxygen ($O_2$) plasma process or a $C_xF_y$ plasma process, though other types of plasma may also be used. In some cases, the descum process is an ashing process. A thorough descum process may be used to ensure that all of the residue is removed. However, in some cases, a thorough descum process may inadvertently remove portions of the upper masks 126, which may cause defects (e.g., bridge defects or other defects) in the semiconductor device 100.

Figure 6:
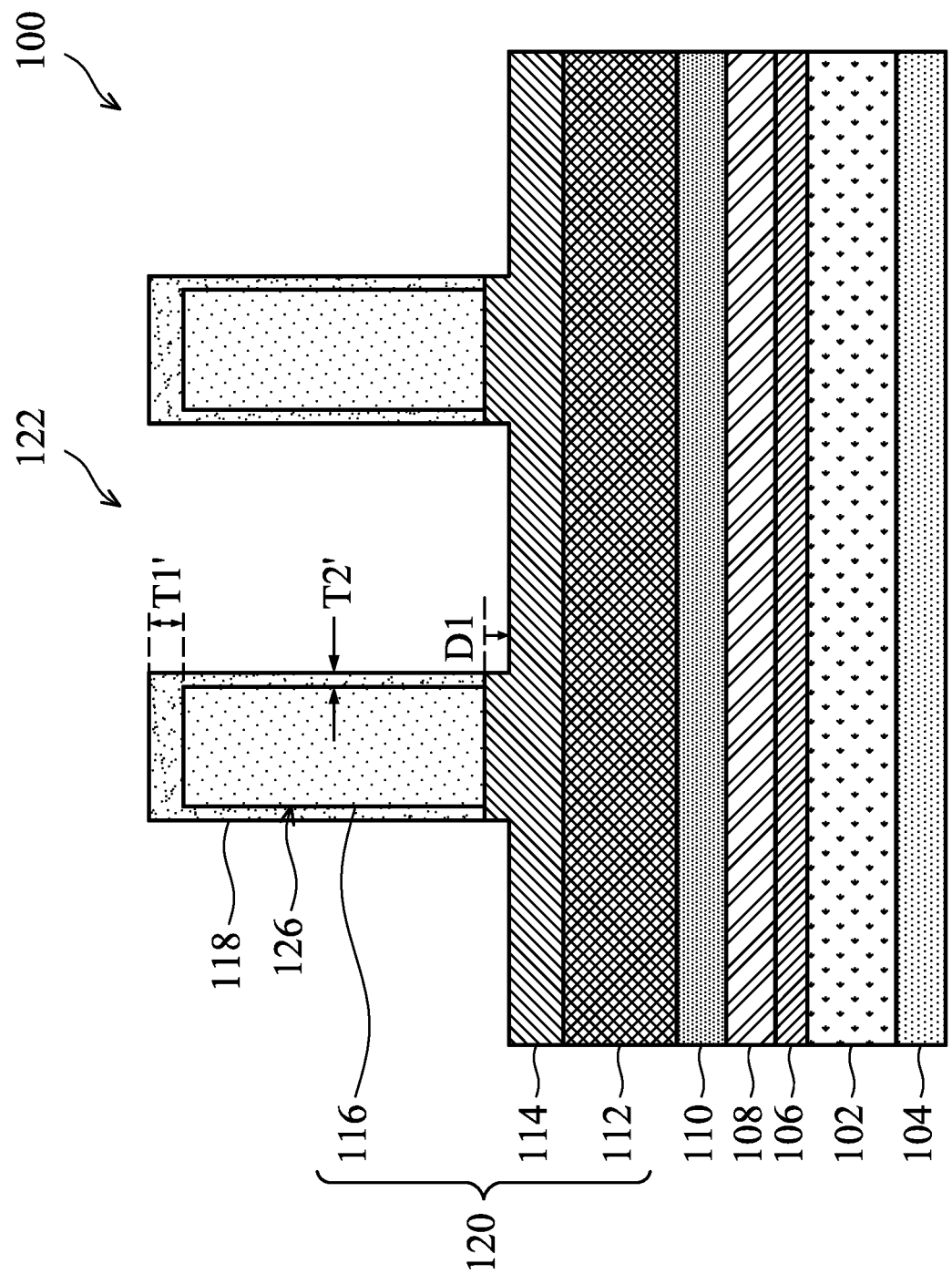
FIGS. 6-17 illustrate cross-sectional views of various intermediary stages of manufacturing a semiconductor device in accordance with some embodiments.

By forming the non-conformal film 118 over the upper masks 126, the upper masks 126 may be protected during a thorough descum process. FIG. 6 shows the example semiconductor device 100 after a descum process has been performed. In this example, the descum process results in the thinning of top thickness T1 to T1', the thinning of T2 to T2' and the removal of any conformal film 118 present on the middle layer 114. For example, the descum process may thin the top thickness T1 by between about 4 nm and about 6 nm to a top thickness T1'. In some cases, the descum process may thin the sidewall thickness T2 by between about 1 nm and about 3 nm to a sidewall thickness T2'. In some cases, the descum process may remove most of or all of the non-conformal film 118 that was deposited on the sidewalls of the upper masks 126. In some embodiments, the top thickness T1 of the deposited non-conformal film 118 is greater than the trench thickness T3 of the deposited non-conformal film 118, and thus the non-conformal film 118 on the surface of the middle layer 114 may be completely removed while a portion of the non-conformal film on the top of the upper masks 126 remains (i.e., having a top thickness T1'). In some cases, forming the non-conformal film 118 to be thinner on the surface of the middle layer 114 may allow the portion of the non-conformal film 118 on the surface of the middle layer 114 to be removed more easily during a descum process. In some embodiments, some of non-conformal film 118 remains on the surface of the middle layer after a descum process. In some embodiments, no non-conformal film 118 is deposited on the middle layer 114 (as shown in FIG. 5C, for example). As shown in FIG. 6, the descum process may also etch or remove portions of the middle layer 114. For example, the descum process may remove portions of the middle layer 114 to a depth D1, which in some cases may be between about 1 nm and about 5 nm. In this manner, the use of a non-conformal film over patterned features may allow for an improved descum process with less risk of damaging the patterned features.

Figure 7:
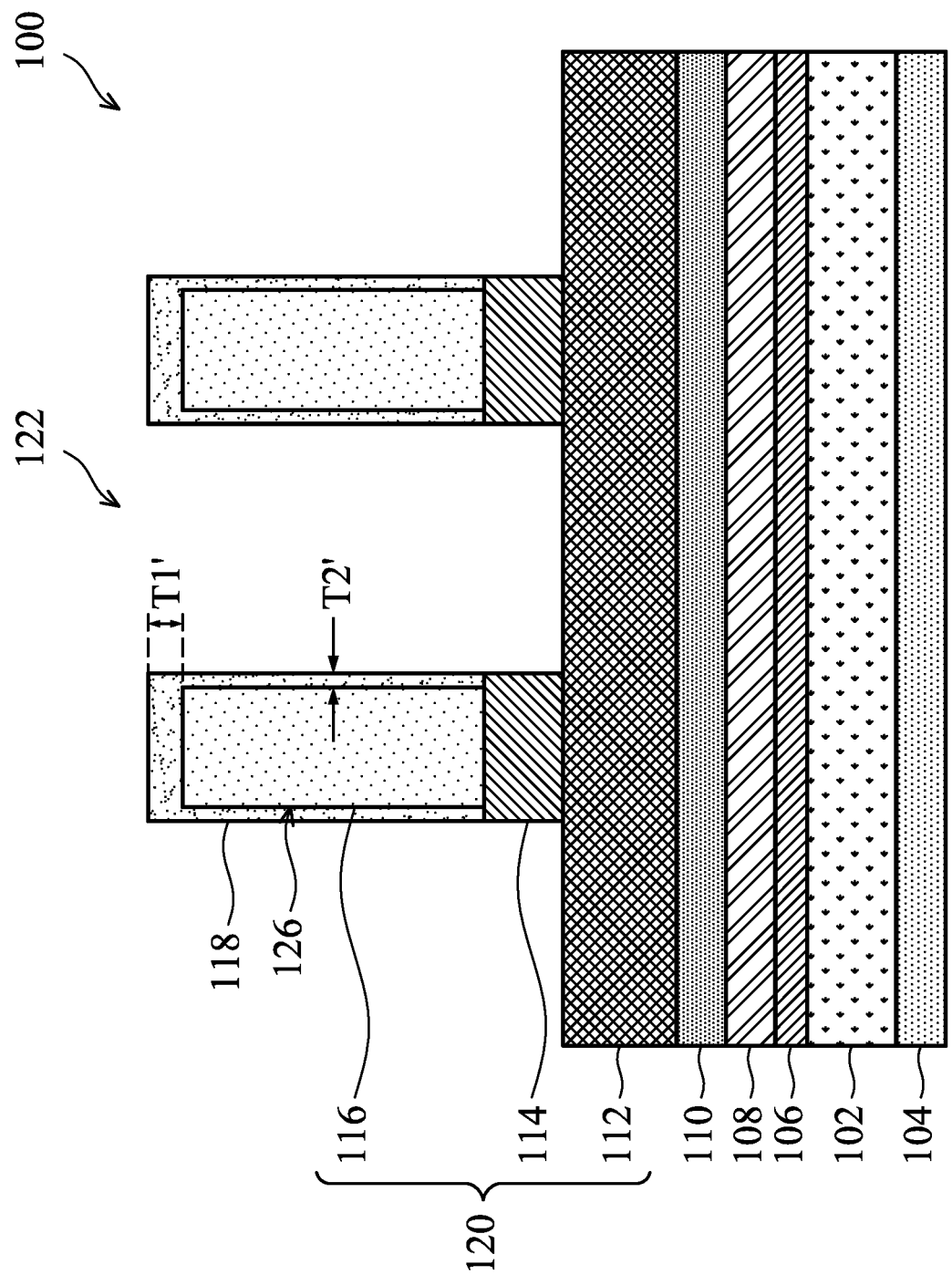

Referring to FIG. 7, after the patterning of the upper layer 116 and the descum process, the pattern of the upper layer 116 (i.e., the upper masks 126) is transferred completely to the middle layer 114 in an etching process. The etching process is anisotropic, so that the openings 122 in the upper layer 116 are extended through the middle layer 114 and have about the same sizes (or are slightly smaller) in the middle layer 114 as they do in the upper layer 116. The resulting structure is illustrated in FIG. 7.

Figure 8:
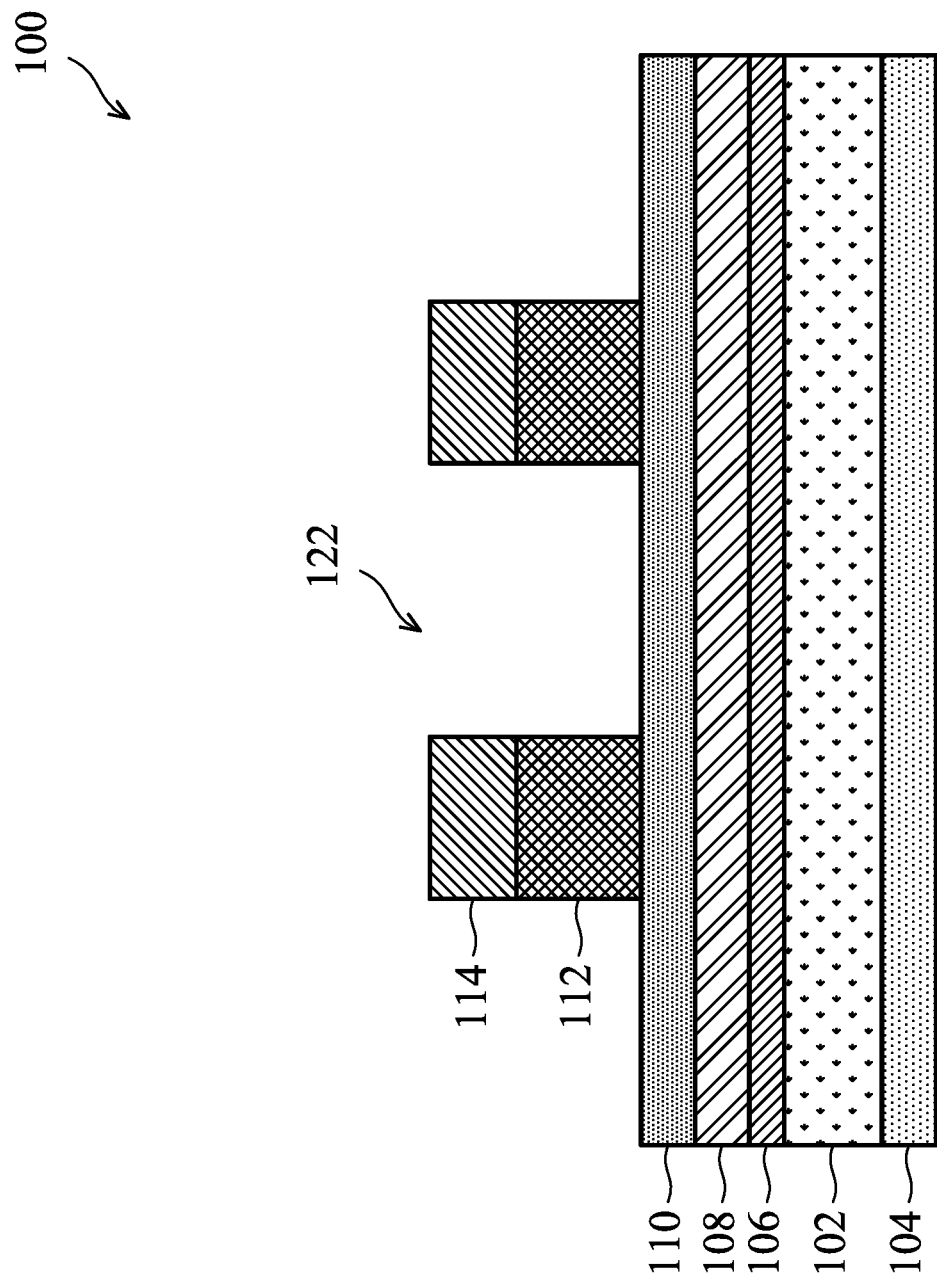

As shown in FIG. 8, an etching process may be performed to transfer the pattern of the middle layer 114 to the bottom layer 112, thereby extending the openings 122 through the bottom layer 112. The etching process of the bottom layer 112 is anisotropic, so that the openings 122 in the middle layer 114 are extended through the bottom layer 112 and have about the same sizes (or are slightly smaller) in the bottom layer 112 as they do in the middle layer 114. As part of etching the bottom layer 112, the upper layer 116 may be consumed.

Figure 9:
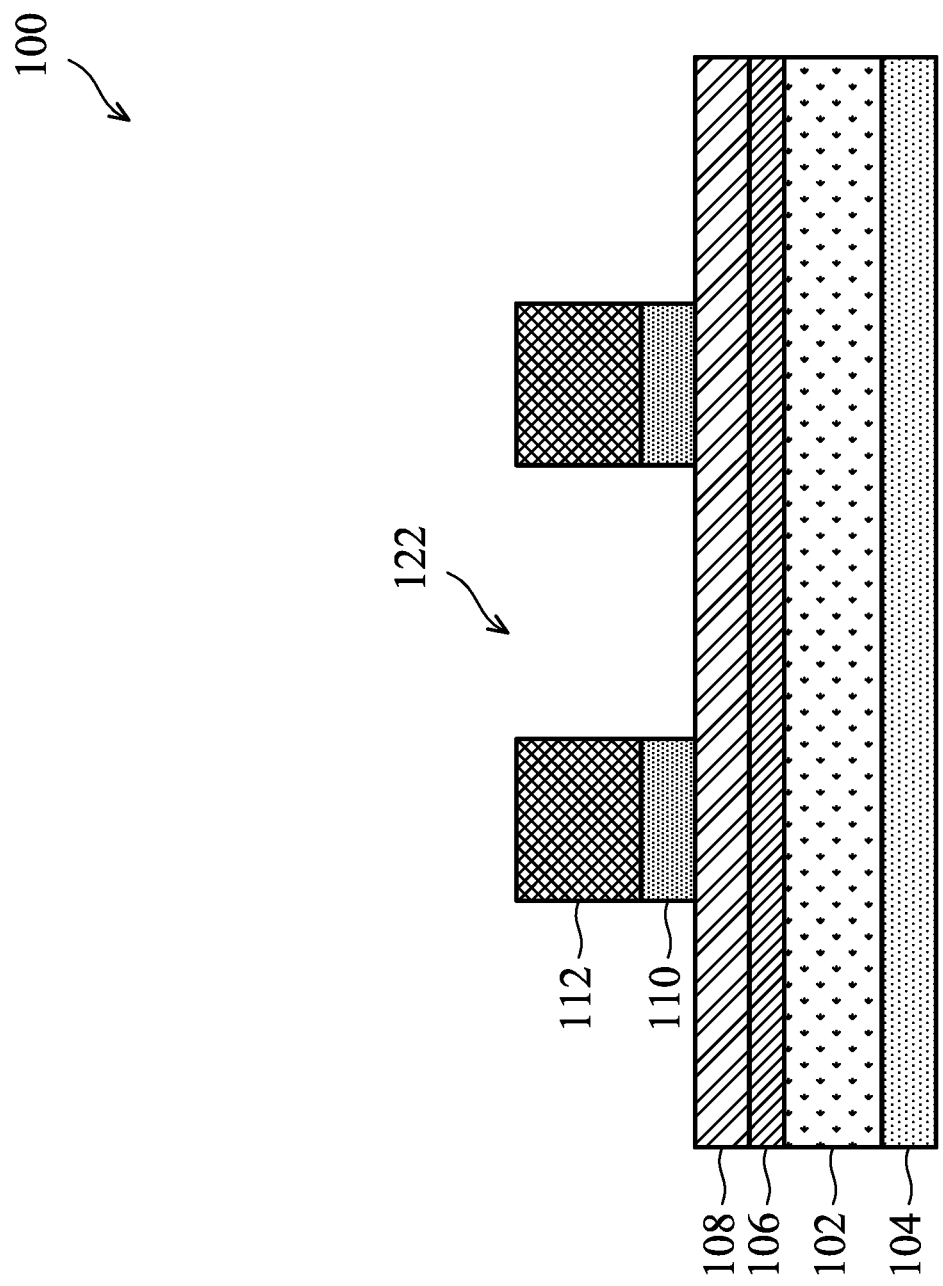
Figure 10:
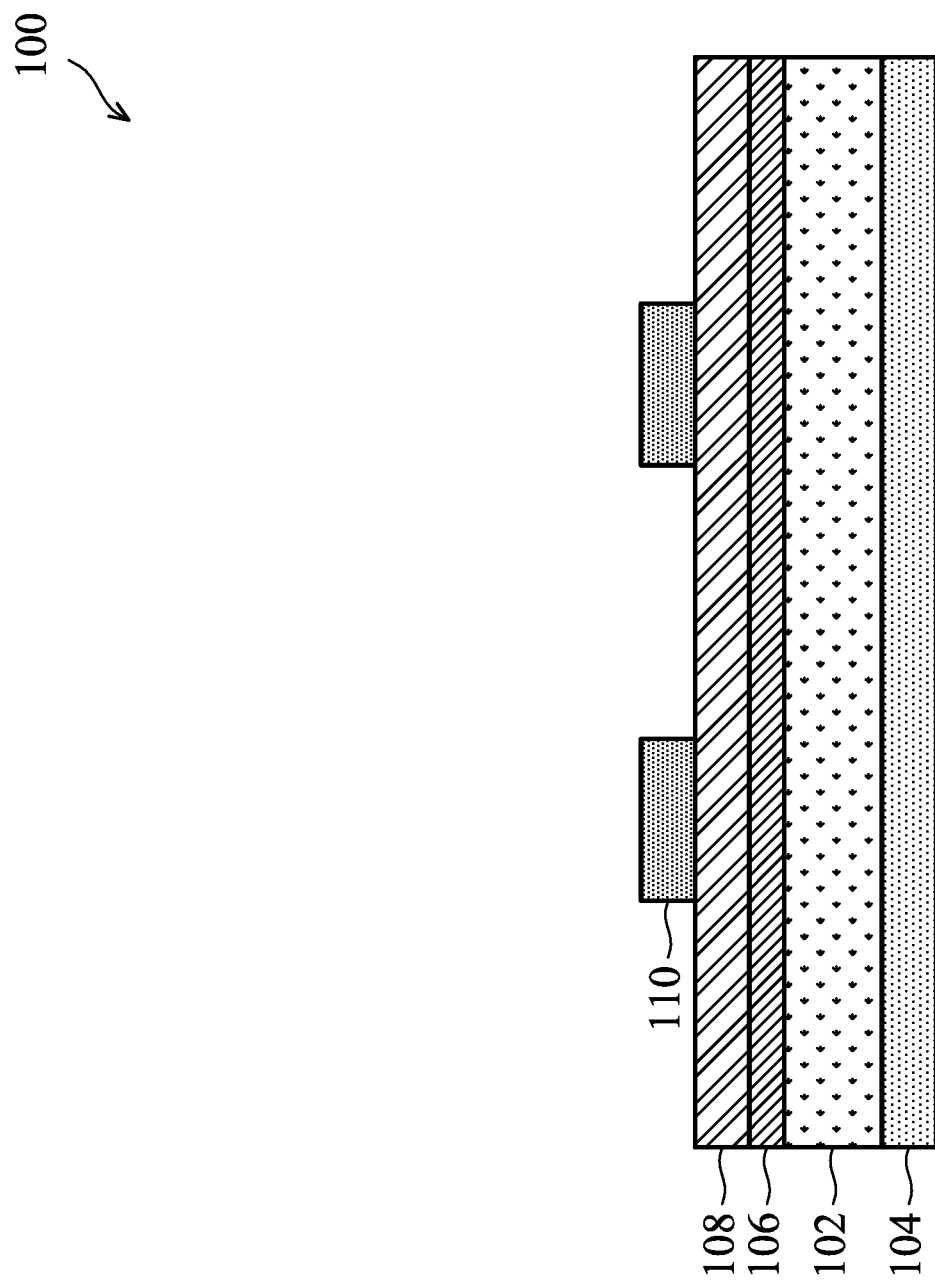

In FIG. 9, the pattern of the bottom layer 112 is transferred to the dielectric layer 110 using an etching process. The etching process is anisotropic, so that the openings 122 in the bottom layer 112 are extended through the dielectric layer 110 and have about the same sizes (or are slightly smaller) in the dielectric layer 110 as they do in the bottom layer 112. During the etching of the dielectric layer 110, the middle layer 114 and bottom layer 112 may be at least partially consumed. In embodiments when the bottom layer 112 is not completely consumed while etching the dielectric layer 110, an ashing process may be performed to remove remaining residue of the bottom layer 112. The remaining structure is depicted in FIG. 10.

Figure 11:
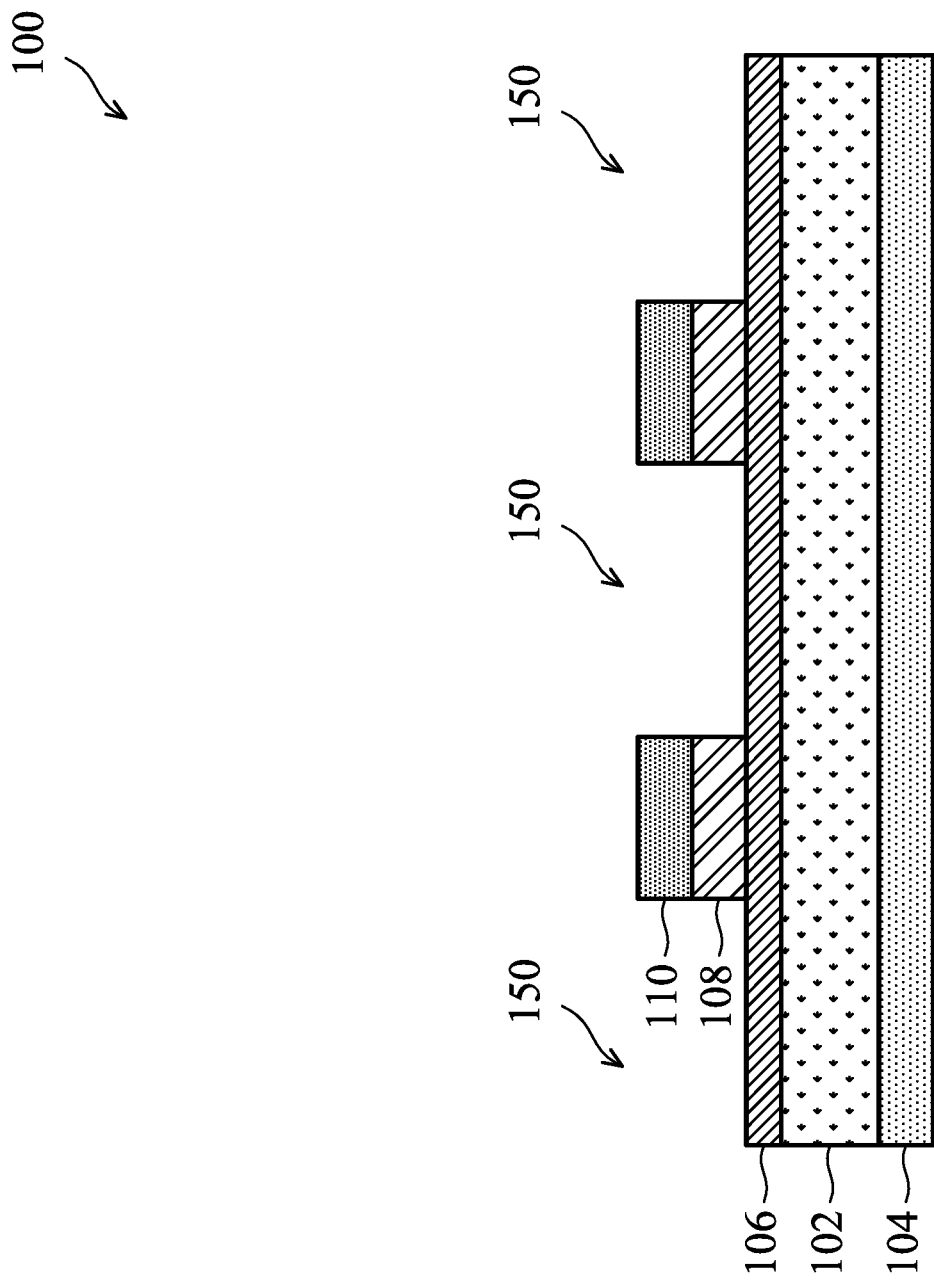
Figure 12:
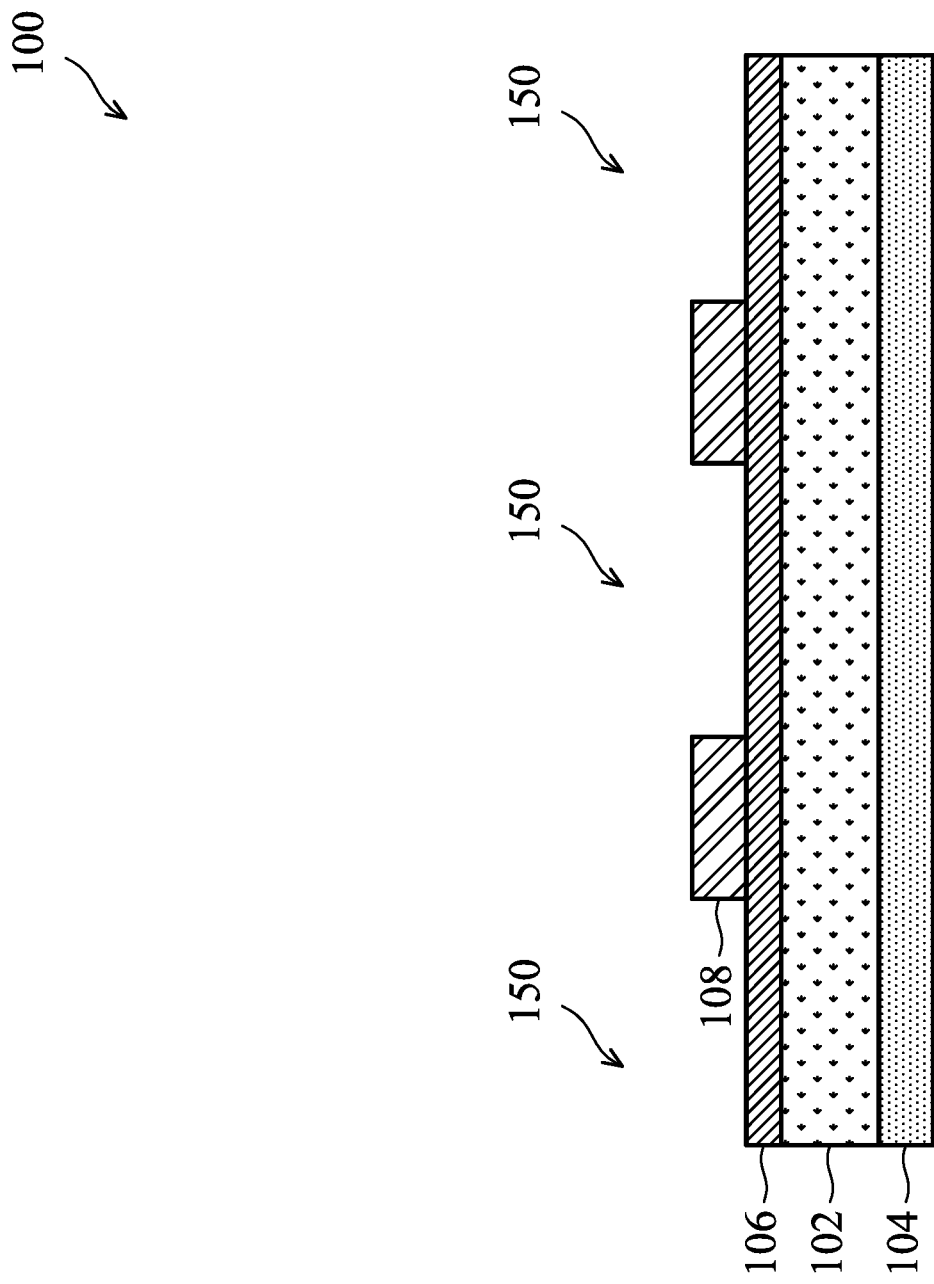

In FIG. 11, the hard mask layer 108 is patterned using the dielectric layer 110 as an etching mask to form openings 150. In some embodiments, etching the hard mask layer 108 includes an anisotropic dry etch and/or a wet etch. After the hard mask layer 108 is patterned, a wet cleaning may be performed to remove any remaining portions of the dielectric layer 110, as shown in FIG. 12.

Figure 13:
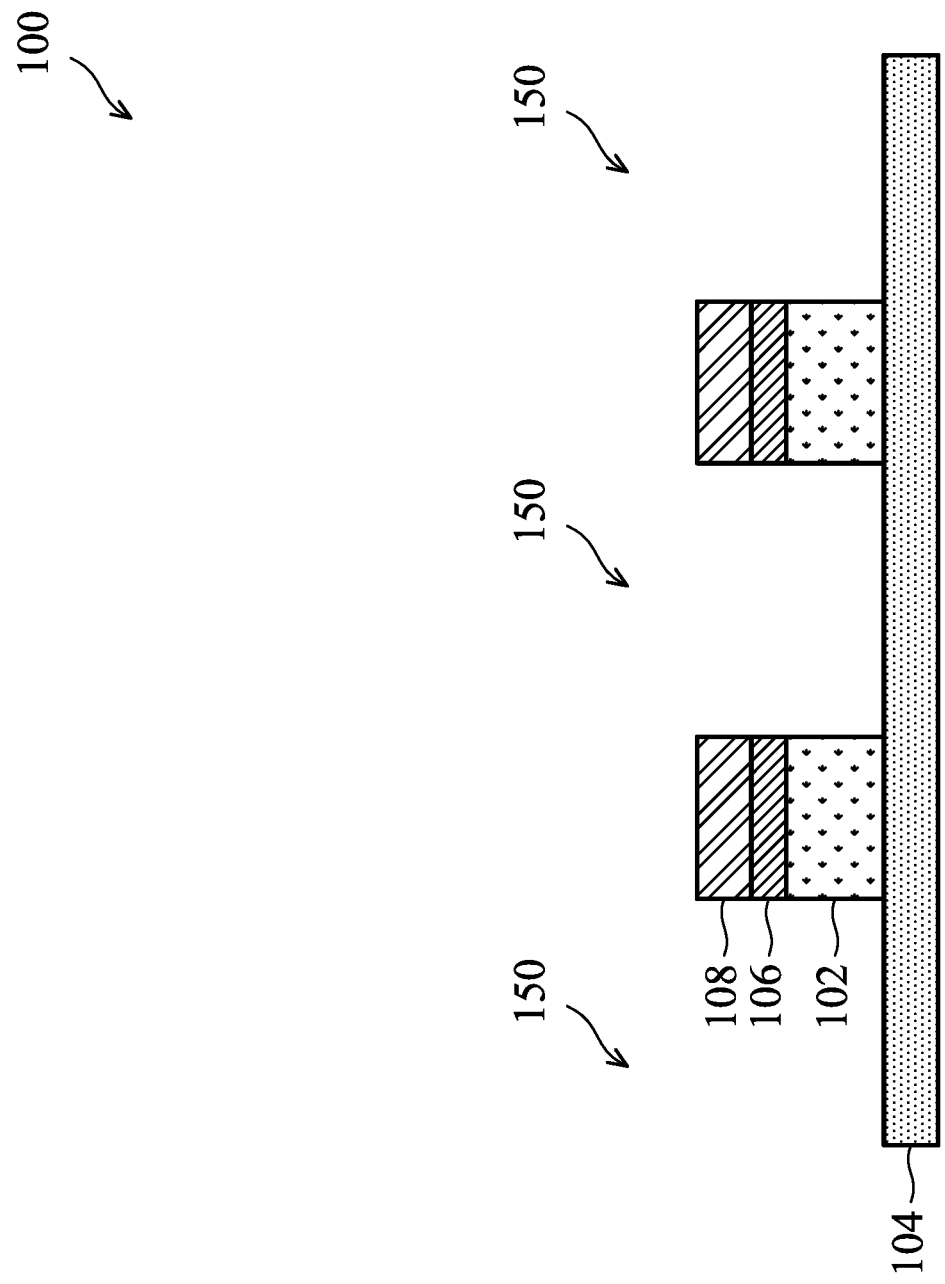
Figure 14:
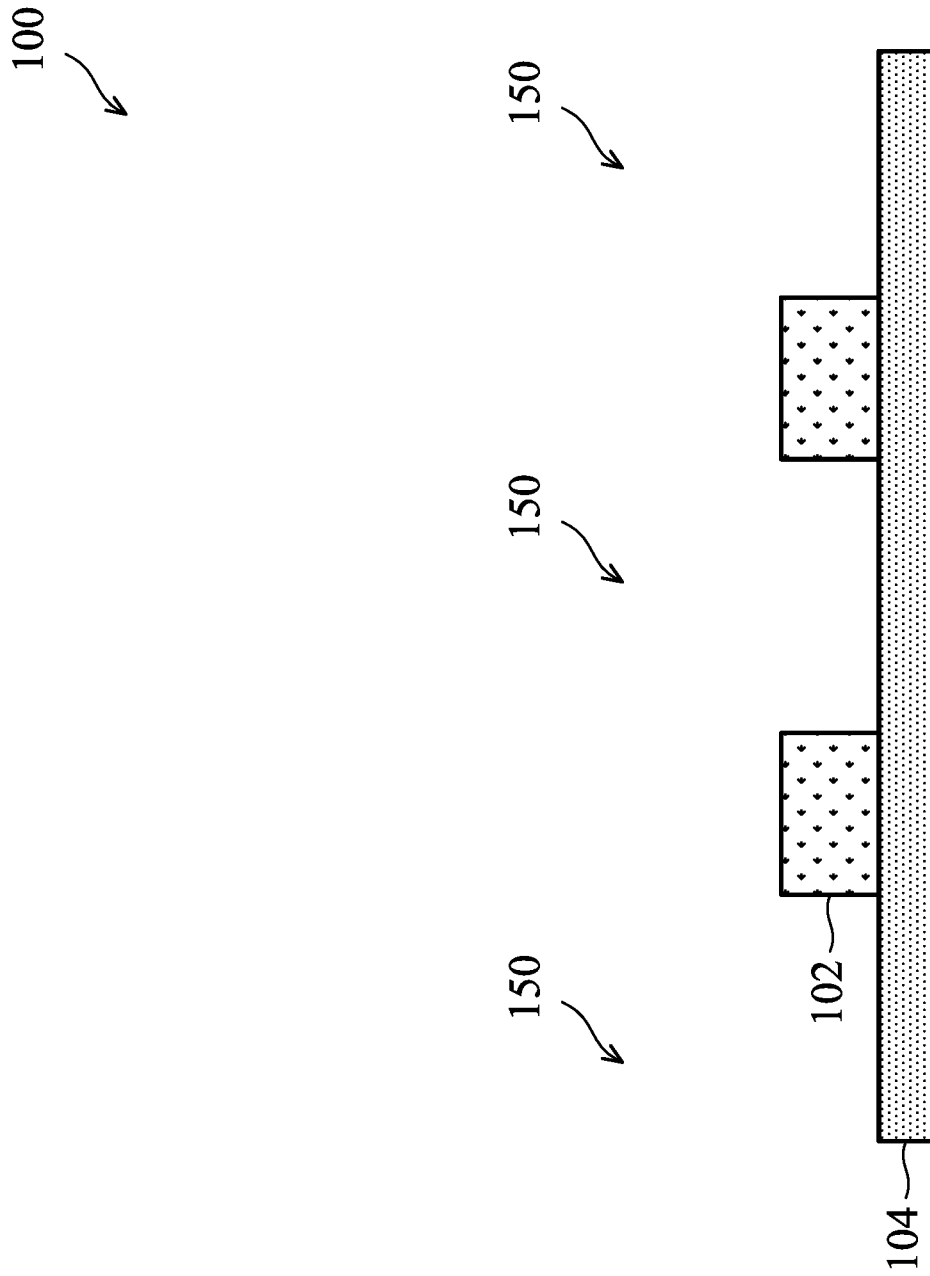

Subsequently, FIG. 13, the hard mask layer 108 is used as an etching mask to extend openings 150 into the target layer 102. Etching the target layer 102 may include an anisotropic dry etch process and/or a wet etch process, which sequentially etches through the ARC layer 106 to the target layer 102. Target layer 102 may be patterned in a single patterning step. After the openings 150 are patterned, a wet cleaning process may be performed to remove any remaining portions of the hard mask layer 108 and the ARC layer 106. The resulting structure is shown in FIG. 14. After openings 150 are patterned in the target layer 102, features may be formed in the openings.

Figure 15:
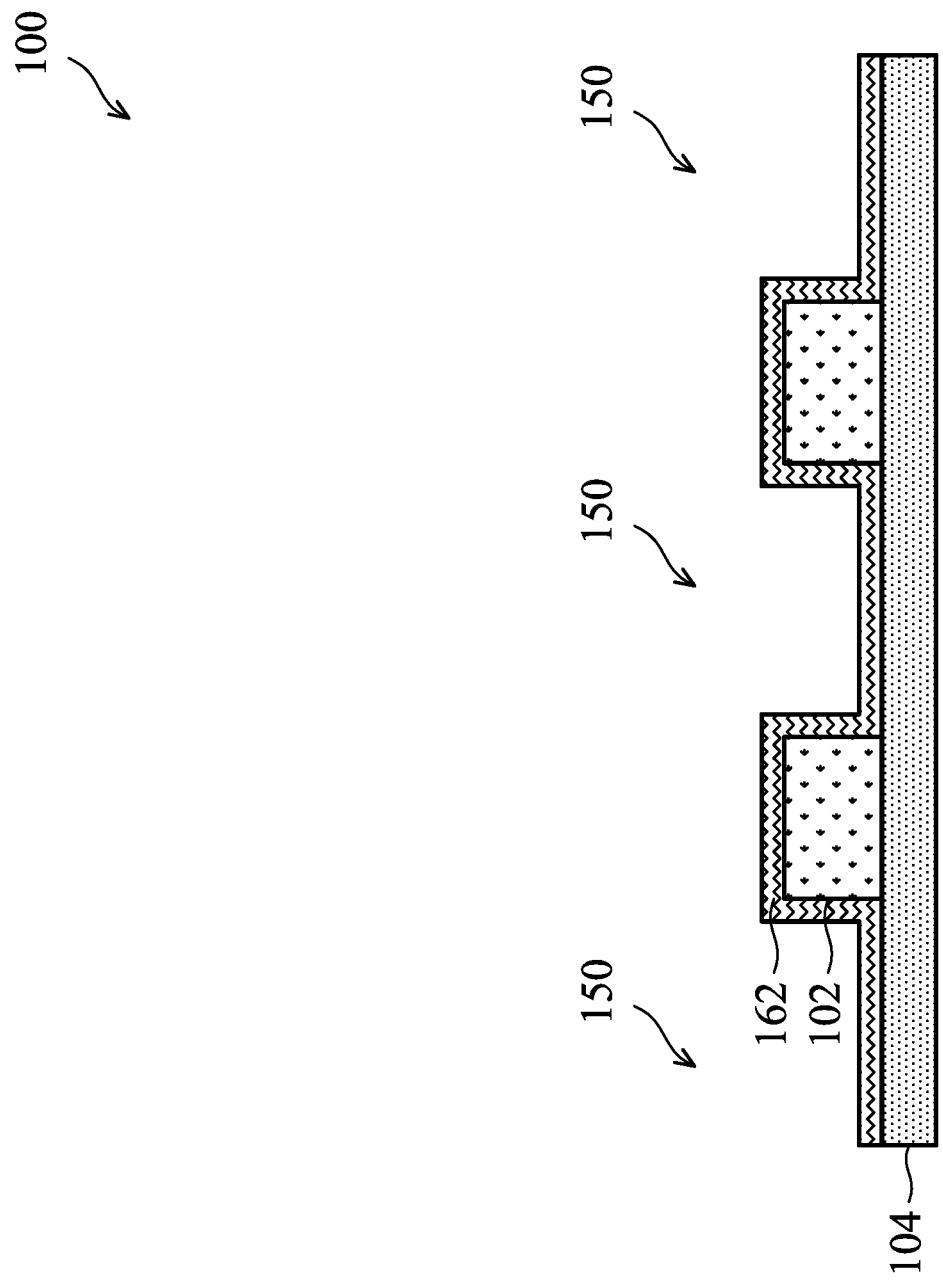

Referring to FIG. 15, one or more liners 162 may be formed along sidewalls and a bottom surface of the openings 150. The liners 162 may include TiO, TiN, TaO, TaN, or the like, and may provide diffusion barrier, adhesion, and/or seed layers for the conductive features. The liners may be deposited using any suitable process, such as PVD, CVD, ALD, PEALD, and the like.

Figure 16:
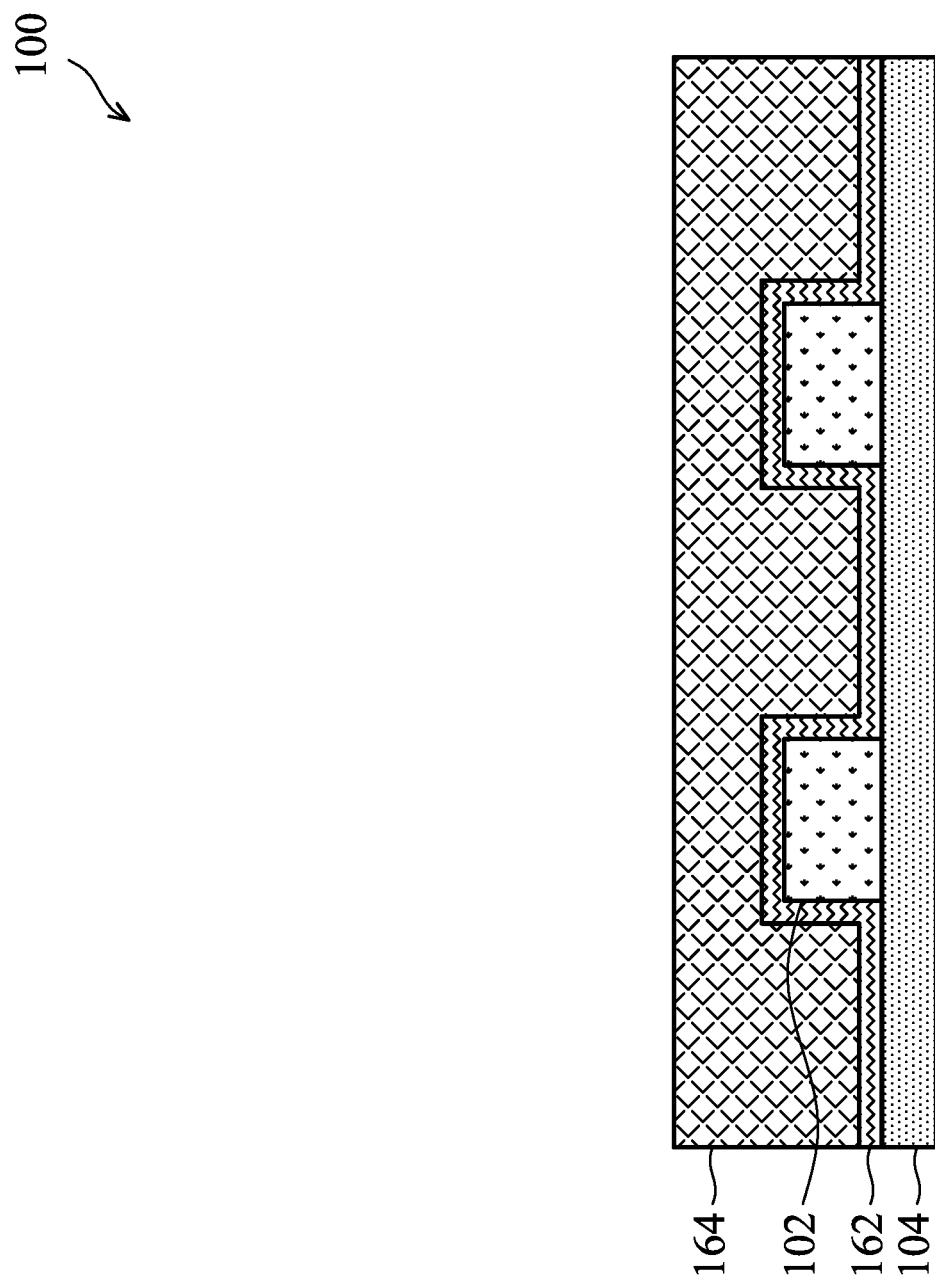
Figure 17:
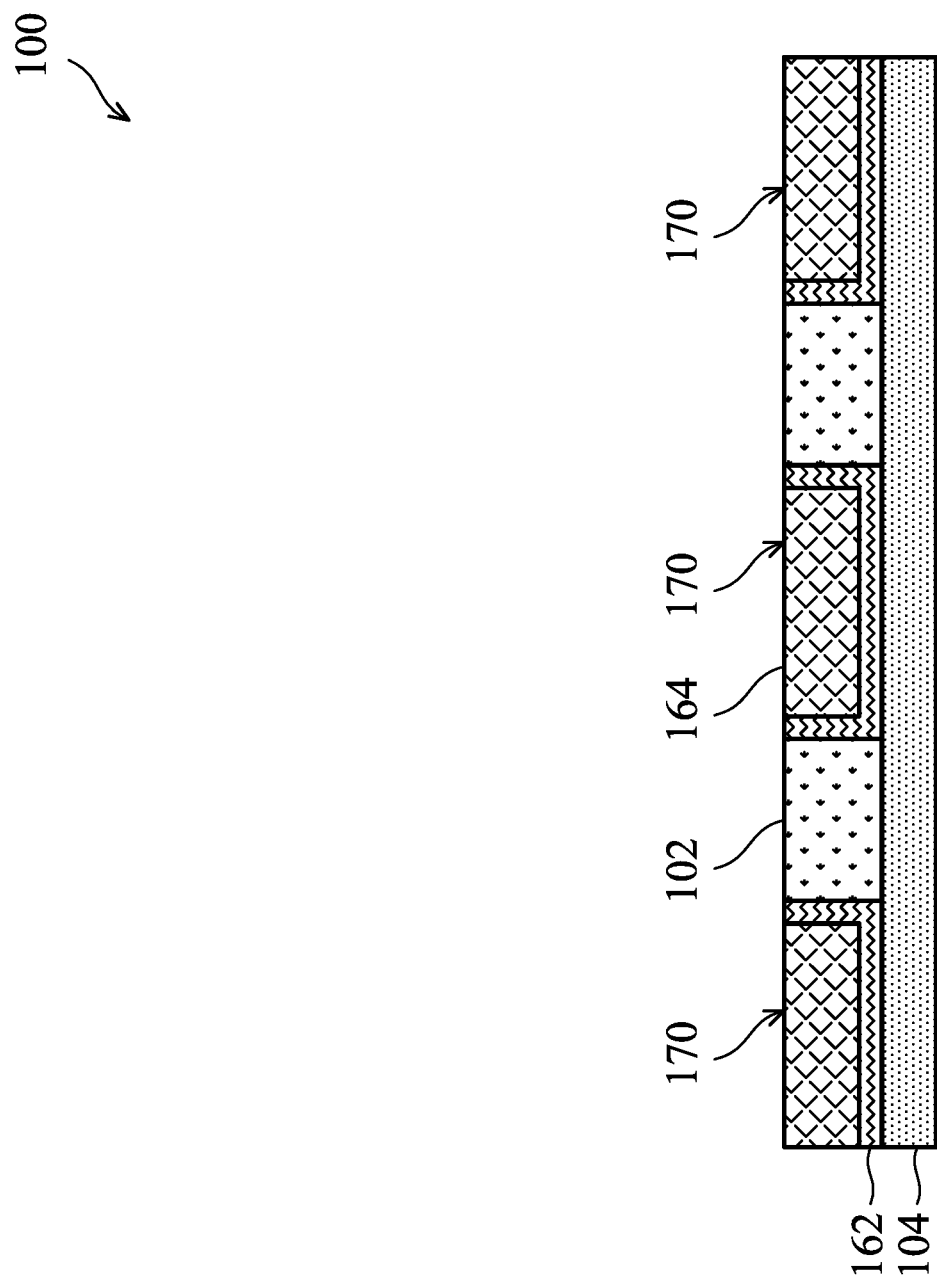

Next, as shown in FIG. 16, remaining portions of the openings 150 may be filled with a conductive material 164, using PVD, ALD, plating, or the like. The conductive material 164 may include copper, aluminum, tungsten, or another conductive material. The conductive material 164 may be initially deposited to overfill the openings 150, as shown in FIG. 16. Next, a planarization process may be performed to remove excess portions of the conductive material 164 over the target layer 102, as shown in FIG. 17. In this manner, the conductive features 170 may be formed in the target layer 102. In some embodiments, the target layer 102 is a low-k dielectric, and the patterned target layer 102 acts as an IMD for an interconnect structure. The conductive features 170 may be features such as lines, vias, contacts, or plugs. The conductive features 170 may be separated by line cuts in some embodiments. These are examples, and other features, including other conductive features, are within the scope of this disclosure.

In other embodiments, the techniques described herein may be used to pattern other types of layers or form other types of features. For example, in some embodiments the target layer 102 is a conductive layer, such as a metal layer or a polysilicon layer, which may be blanket deposited. A conductive layer may be patterned using techniques herein to form a metal hardmask, conductive lines, a patterned seed layer, or other types of features. Embodiment patterning processes may also be applied to a suitable type of target layer 102 in order to pattern semiconductor gates or dummy gates of FinFETS (or other types of transistors). In other embodiments, the target layer 102 is an inter-layer dielectric (ILD) layer, and embodiment patterning processes may be applied to the target layer 102 to form conductive features within the target layer 102 such as lines, contacts, vias, plugs, or the like.

As described above, the use of a non-conformal film (e.g., non-conformal film 118) over a patterned photoresist may allow a more thorough descum process to be performed without increasing the chance of damaging the photoresist. While the example process shown in FIGS. 1-2 and 6-17 describes the formation of conductive features in a target layer, the techniques described herein may also be used for any process in which a descum process is performed after patterning a layer. For example, the techniques may be used for a process in which a descum process is performed to remove photoresist residue after patterning a photoresist layer. The non-conformal film described herein may protect a patterned feature without significantly increasing the width of the patterned feature. For example, the thickness of the non-conformal film formed on the sidewalls of the feature may be less than the thickness of the non-conformal film formed on the top of the feature. In this manner, the critical dimensions of etch masks may be substantially preserved. In some cases, a non-conformal film may be purposefully formed on the sidewalls of the feature in order to increase the critical dimensions of etch masks, for example, in order to reduce the width of a trench between the etch masks.

A method is provided in accordance with some embodiments. The method includes forming a first mask layer over an underlying layer, patterning the first mask layer to form a first opening, forming a non-conformal film over the first mask layer, wherein a first thickness of the non-conformal film formed on the top surface of the first mask layer is greater than a second thickness of the non-conformal film formed on a sidewall surface of the first mask layer, performing a descum process, wherein the descum process removes a portion of the non-conformal film within the first opening, and etching the underlying layer using the patterned first mask layer and remaining portions of the non-conformal film as an etching mask. In an embodiment, patterning the first mask layer includes patterning the first mask layer using an extreme ultraviolet (EUV) photolithography process. In an embodiment, forming the non-conformal film includes forming the non-conformal film on a bottom surface of the first opening. In an embodiment, the descum process etches portions of the underlying layer. In an embodiment, the first thickness is greater than a third thickness of the non-conformal film formed on the bottom surface of the first opening. In an embodiment, the first thickness is between about 5 nm and about 10 nm, and the second thickness is between about 1 nm and about 3 nm. In an embodiment, forming the non-conformal film includes depositing the non-conformal film using a Plasma-Enhanced Atomic Layer Deposition (PEALD) process. In an embodiment, bis(diethylamino)silane is used as a precursor during the PEALD process. In an embodiment, the non-conformal film includes SiCN. In an embodiment, the first mask layer is the top layer of a tri-layer photoresist. In an embodiment, the descum process includes an ashing process.

A method is provided in accordance with some embodiments. The method includes forming a tri-layer structure over a substrate, the tri-layer structure including an upper layer, a middle layer, and a bottom layer, patterning the upper layer to form a first mask pattern, the first mask pattern including a first opening, depositing a protective layer extending over a top surface of the first mask pattern to a top surface of the middle layer within the first opening, wherein a first portion of the protective layer over the top surface of the first mask pattern is thicker than a second portion of the protective layer over the top surface of the middle layer within the first opening, performing a descum process, wherein the descum process removes the second portion of the protective layer, etching the middle layer using the first mask pattern and remaining portions of the protective layer as an etching mask to form a second mask pattern, and etching the bottom layer using the second mask pattern as an etching mask to form a third mask pattern. In an embodiment, the protective layer includes SiCN. In an embodiment, the descum process etches the top surface of the middle layer within the first opening. In an embodiment, the ratio of the thickness of the first portion of the protective layer to the thickness of the second portion of the protective layer is between 3:1 and 5:1. In an embodiment, depositing the protective layer includes placing the substrate in a deposition chamber. In an embodiment, depositing the protective layer also includes performing one or more deposition cycles, each of the one or more deposition cycles including flowing one or more precursor materials into the deposition chamber, purging the deposition chamber of precursor materials by flowing one or more purging gases into the deposition chamber, igniting a plasma within the deposition chamber, and purging the deposition chamber by flowing one or more purging gases into the deposition chamber. In an embodiment, the method further includes etching a second opening in the substrate using the third mask pattern as an etching mask. In an embodiment, the method further includes depositing a conductive material in the second opening to form a conductive line in the substrate.

A method is provided in accordance with some embodiments. The method includes patterning a trench in a photoresist layer over a dielectric layer, forming a non-conformal film over the trench, wherein portions of the non-conformal film adjacent the trench are thicker than portions of the non-conformal film within the trench, removing residue within the trench, and etching the dielectric layer to extend the trench into the dielectric layer. In an embodiment, portions of the non-conformal film adjacent the trench are about three times thicker than portions of the non-conformal film within the trench. In an embodiment, the trench has a width of about 20 nm. In an embodiment, removing residue within the trench includes a plasma process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first mask layer over an underlying layer;
patterning the first mask layer to form a first opening;
forming a protective layer over the patterned first mask layer, wherein a first thickness of the protective layer on a top surface of the first mask layer is greater than a second thickness of the protective layer on a sidewall surface of the first mask layer, the underlying layer being exposed in the first opening;
performing a descum process, wherein after performing the descum process, a third thickness of the protective layer remaining on the top surface of the first mask layer is greater than a fourth thickness of the protective layer remaining on the sidewall surface of the first mask layer; and
etching the underlying layer using the patterned first mask layer and remaining portions of the protective layer as an etching mask.

2. The method of claim 1, wherein forming the protective layer comprises depositing the protective layer using a plasma-enhanced atomic layer deposition (PEALD) process.

3. The method of claim 2, wherein bis(diethylamino)silane is used as a precursor during the PEALD process.

4. The method of claim 1, wherein the protective layer comprises SiCN, SiN, SiON, SiCON, SiC, SiOC, $SiC_xN_y$, $SiO_x$, or a combination thereof.

5. The method of claim 1, wherein patterning the first mask layer comprises an extreme ultraviolet (EUV) photolithography process.

6. The method of claim 1, wherein a ratio of the first thickness of the protective layer to the second thickness of the protective layer is in a range from 3:1 to 5:1.

7. The method of claim 1, wherein the first mask layer is the top layer of a tri-layer photoresist.

8. The method of claim 1, wherein the descum process comprises an ashing process.

9. The method of claim 1, wherein the descum process comprises a plasma process.

10. A method comprising:
forming a tri-layer masking layer over a substrate, the tri-layer masking layer comprising a bottom layer over the substrate, a middle layer over the bottom layer, and an upper layer over the middle layer;
patterning a trench in the upper layer;
forming a protective layer over the upper layer and the middle layer in the trench, wherein a first portion of the protective layer on a top surface of the protective layer is thicker than a second portion of the protective layer on a sidewall of the upper layer, the middle layer in the trench being substantially free of the protective layer;
performing a descum process within the trench, wherein performing the descum process within the trench partially removes the middle layer;
after performing the descum process, etching the middle layer to extend the trench into the middle layer; and
etching the bottom layer to extend the trench into the bottom layer, wherein etching the bottom layer removes remaining portions of the protective layer and the upper layer.

11. The method of claim 10, wherein performing the descum process within the trench comprises a plasma process.

12. The method of claim 10, wherein performing the descum process within the trench comprises an ashing process.

13. The method of claim 10 further comprising:
forming an anti-reflective coating over the substrate;
forming a mask layer over the anti-reflective coating; and
forming a dielectric layer over the mask layer, the tri-layer masking layer being formed over the dielectric layer.

14. The method of claim 13 further comprising:
forming a target layer over the substrate, the anti-reflective coating being over the target layer;
etching the dielectric layer to extend the trench into the dielectric layer;
removing remaining portions of the bottom layer;
etching the mask layer to extend the trench into the mask layer;
removing remaining portions of the dielectric layer;
etching the anti-reflective coating and the target layer to extend the trench into anti-reflective coating and the target layer; and
removing remaining portions of the mask layer.

15. The method of claim 10, wherein forming the protective layer comprises:
placing the substrate in a deposition chamber; and
performing one or more deposition cycles, each of the one or more deposition cycles comprising:
flowing one or more precursor materials into the deposition chamber;
purging the deposition chamber of precursor materials by flowing one or more purging gases into the deposition chamber;
igniting a plasma within the deposition chamber; and
purging the deposition chamber by flowing one or more purging gases into the deposition chamber.

16. The method of claim 10, further comprising etching a second opening in the substrate using the bottom layer as an etching mask.

17. The method of claim 16, further comprising depositing a conductive material in the second opening to form a conductive line in the substrate.

18. A method comprising:
forming a tri-layer structure over a substrate, the tri-layer structure comprising an upper layer, a middle layer, and a bottom layer;
patterning the upper layer to form a first mask pattern, the first mask pattern comprising a first opening, the patterning forming a residue on the middle layer in the first opening;
depositing a non-conformal film extending over a top surface of the first mask pattern to a top surface of the middle layer within the first opening, wherein a first portion of the non-conformal film over the top surface of the first mask pattern is thicker than a second portion of the non-conformal film on a sidewall of the first mask pattern within the first opening, a top surface of the middle layer in the first opening being substantially free of the non-conformal film;
removing the residue from the middle layer in the first opening;
etching the middle layer using the first mask pattern and remaining portions of the non-conformal film as an etching mask to form a second mask pattern; and
etching the bottom layer using the second mask pattern as an etching mask to form a third mask pattern, wherein etching the bottom layer removes the remaining portions of the non-conformal film and the patterned upper layer.

19. The method of claim 18, wherein a ratio of the thickness of the first portion of the non-conformal film to the thickness of the second portion of the non-conformal film is between 3:1 and 5:1.

20. The method of claim 18, wherein the non-conformal film comprises SiCN, SiN, SiON, SiCON, SiC, SiOC, $SiC_xN_y$, $SiO_x$, or a combination thereof.

* * * * *